(12) United States Patent
Nordal et al.

(10) Patent No.: US 6,219,160 B1
(45) Date of Patent: Apr. 17, 2001

(54) OPTICAL LOGIC ELEMENT AND METHODS FOR RESPECTIVELY ITS PREPARATION AND OPTICAL ADDRESSING, AS WELL AS THE USE THEREOF IN AN OPTICAL LOGIC DEVICE

(75) Inventors: Per-Erik Nordal, Asker; Hans Gude Gudesen, Gamle Fredrikstad; Geirr Ivarsson Leistad, Sandvika, all of (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/230,920

(22) PCT Filed: Jun. 5, 1998

(86) PCT No.: PCT/NO98/00168

§ 371 Date: Mar. 25, 1999

§ 102(e) Date: Mar. 25, 1999

(87) PCT Pub. No.: WO98/55897

PCT Pub. Date: Dec. 10, 1998

(30) Foreign Application Priority Data

Jun. 6, 1997 (NO) ...................................... 972574

(51) Int. Cl.[7] .............................. G02F 3/00; G11C 13/04
(52) U.S. Cl. ......................... 359/107; 359/900; 365/106; 365/112
(58) Field of Search ............................. 359/3, 4, 6, 900, 359/107; 365/106, 107, 112, 119, 234, 235, 215, 216

(56) References Cited

U.S. PATENT DOCUMENTS

| | | | |
|---|---|---|---|
| 4,288,861 | * 9/1981 | Swainson et al. | 365/107 |
| 4,818,877 | * 4/1989 | Ayrai et al. | 250/361 R |
| 5,253,198 | 10/1993 | Birge et al. | 365/106 |
| 5,479,384 | 12/1995 | Toth et al. | 364/14 |
| 5,559,732 | 9/1996 | Birge | 365/120 |
| 5,922,843 | * 7/1999 | Tan et al. | 365/112 |
| 6,046,925 | * 4/2000 | Tsien et al. | 365/111 |

FOREIGN PATENT DOCUMENTS

| | | |
|---|---|---|
| WO 94/05008 | * 3/1994 | (WO) . |
| WO 95/31515 | 11/1995 | (WO) . |
| WO 95/31515 A1 | 11/1995 | (WO) . |
| WO 96/21228 | 7/1996 | (WO) . |
| WO 97/48009 | 12/1997 | (WO) . |

OTHER PUBLICATIONS

Abstract of JP 3-237769 A (Fuji Photo Film Co. LTD.), Oct. 23, 1991.

(List continued on next page.)

Primary Examiner—Thong Nguyen
Assistant Examiner—John Juba, Jr.

(57) ABSTRACT

In a multistable optical logic element with a light-sensitive organic material (1) which undergoes a photocycle with several physical states by irradiation with light, and wherein a physical state is assigned a logical value which can be changed by addressing the element optically, the element initially before the addressing is in a metastable state generated in advance. A multistable optical logic element has been made proximity-addressable by providing at least a color light source (2) for optical addressing and at least one color-sensitive optical detector (5) adjacent to the light-sensitive material. In a method for preparing of the light-sensitive material (1) a desired initial metastable state is generated in the photocycle and assigned a determined logical value for the element. In a method for optical addressing of the optical logic element steps for respectively writing and storing, reading, erasing and switching comprises generating transitions between states in the photocycle and detection of the states. Use in an optical logical device for storing and processing of data.

34 Claims, 11 Drawing Sheets

OTHER PUBLICATIONS

Abstract of JP 3–252530 A (Fuji Photo Film Co. LTD), Nov. 11, 1991.
Abstract of JP 3–81756 A (Fuji Photo Film Co. LTD.), Apr. 8, 1991.
Patent Abstracts of Japan, JP A3–237769, Oct. 23, 1991.
Patent Abstracts of Japan, JP A3–252530, Nov. 11, 1991.
Patent Aabstracts of Japan, JP A3–81756, Apr. 8, 1991.
"Protein–Based Computers", Robert R. Birge, Scientific American, Mar. 1995, pp. 90–95.
"Optical Nonlinearity And Bistability In Organic Photochromic Thin Films", C.J.G. Kirkby et al., Optics Communications, vol. 56, No. 4, Dec. 15, 1989, pp. 288–292.

Light–emitting Diodes With Variable Colours From Polymer Blends, M. Berggren, et al., Letters To Nature, vol. 372, Dec. 1, 1994, pp. 444–446.

"Biopolymers For Real–Time Optical", *Optical Processing and Computing* Vladimir Yu. Bazhenov et al., Institute of Physics, Academy of Sciences of the Ukrainian SSR, Kiev., USSR, pp. 103–144(1989).

"Photophysics and Molecular Electronic Applications of the Rhodopsins", Robert R. Birge, Ann. Rev. Phys. Chem., vol. 41, pp. 683–733 (1990).

* cited by examiner

OPTICAL LOGIC ELEMENT AND METHODS FOR RESPECTIVELY ITS PREPARATION AND OPTICAL ADDRESSING, AS WELL AS THE USE THEREOF IN AN OPTICAL LOGIC DEVICE

This application is the national phase under 35 U.S.C. §371 of prior PCT International Application No. PCT/NO98/00168 which has an International filing date of Jun. 5, 1998 which designated the United States of America.

FIELD OF THE INVENTION

The invention concerns a multistable optical logic element and more particularly a proximity-addressable multistable optical logic element, comprising a light-sensitive organic material which can undergo a photocycle by irradiation light of one or more suitable wavelength, wherein the photocycle in addition to the physical ground state comprises one or more metastable physical states, wherein the physical state of the logic element is changed in the photocycle by causing a transition from a metastable state to another metastable state or by causing a transition from the ground state to a metastable state and vice versa, wherein a physical state is assigned a determined logical value, and wherein a change of the physical state of the logic element causes a change in its logic value and takes place by addressing the logic element optically for writing, reading, storing, erasing and switching of an assigned logic value. The invention also concerns a method for preparation of a light-sensitive organic material which can undergo a photocycle by irradiation with light of one or more suitable wavelengths, wherein the photocycle in addition to the physical ground state comprises one or more metastable physical states, and wherein the light-sensitive organic material is used as a switchable or data storage medium in a multistable logic element as stated above.

The invention also comprises a method for optical addressing of an optical logic element as stated above and with light-sensitive organic material prepared by method as stated above, such that the optical logic element is in an initial metastable physical state, and wherein the optical addressing comprises steps for writing, reading, storing, erasing and switching of a logic value assigned to the optical logic element.

Finally the invention concerns the use of the multistable optical logic element and the method for optical addressing of the multistable optical logic element.

DESCRIPTION OF RELATED ART

Digital computers are today essentially based on the use of semiconductor technology, i.e. electronic circuits which are driven and switched by electric currents. In case there are desired a particular fast storage and retrieval of data, there are for this purpose used storage mediums which also are based on semiconductor technology. For mass storage of data there have over decades been used magnetic storage mediums which have the advantage that the stored data quickly may be erased and new data once more stored in these storage mediums. For storage of large data volumes which shall be stored only once and then thereafter only read, optical storage mediums of the type WORM (Write Once Read Many Times) have in the later years seen an increasing use. Examples of such media are CD-ROM and the laser disk which not only have been used for storing databases and other substantially information-carrying files, but which have seen a wide distribution and popularity as storage medium for program sources used in audio-visual media, for instance for storing of music and movies.

In the later years there has also been proposals to store and process data by means of optical devices only. Optical dataprocessing has generally a number of advantages over data processing based on common semiconductor technology such as silicon technology. Optical dataprocessing may in any case theoretically increase the capacity for processing and storing of data with at least one order of magnitude beyond what is possible with today's conventional semiconductor technology. Optical dataprocessing further is expected to give increased error safety and processing speed, while it comports the possibility of a fast processing of data, not least by that devices for optical data storage and dataprocessing may be made substantially smaller.

In order to realise the potential which optical data storage and optical dataprocessing seem to imply, it is necessary to find media which makes it possible to realise the technology in a suitable manner. Particularly the interest has been concentrated on light-sensitive organic materials, for instance different proteins, and in this connection there shall generally be referred to an article of Robert R. Birge, "Protein-Based Computers", Scientific American, March 1995, pp. 2–7. An instance of a light-sensitive organic material of this kind is bacteriorhodopsin which is a biologically generated protein compound and discussed in detail in the above-mentioned article by Birge. It may be produced in large scale by fermentation and has a high chemical and physical stability. When bacteriorhodopsin is illuminated with light of a suitable wavelength, it goes through changes which manifest themselves in different ways, included as modifications of the optical absorption properties. These changes are as described in Birge's article, connected with transition from a ground state bR and to various distinct energy states, denoted K, L, M etc. which each has a residence time which may be influenced thermally and/or optically. The sequential progression from the ground state and further through a set of such states is in the following denoted as the photocycle of the bacteriorhodopsin.

The possibility for optical data storage and optical data processing in bacteriorhodopsin was realised several years ago. A method for storage of data in that connection would be to transfer the bacteriorhodopsin from the bR state which, e.g. may represent a logic 0, to an intermediate state in the photocycle and with long lifetime, as this intermediate state may be denoted as a metastable state and for instance represent a logical 1. When natural bacteriorhodopsin is stimulated by light, it goes, however, through the whole photocycle and returns to the ground state bR in milliseconds, the longest-living intermediate state being the M state. A great research effort has been devoted to modify the original BR-molecule such that its lifetime in the M state is increased, for instance by experiments with mutants and the use of chemical modifications. This has resulted in that the lifetime of the M state has been increased to several seconds and even minutes, yet this is all too short time in relation to what is regarded as necessary for archival storage of data, namely many years, or even decades. Nevertheless the M state has been investigated with the aim of use in optical data storage wherein information is to be stored and retrieved during short intervals or wherein the stored data constantly is subjected to a refresh. It is also possible to interrupt the residence time in the M state by illumination with blue light, something which efficiently corresponds to a delete or erase operation. The limited lifetime in M state is, however, a negative factor in regard of practical uses, as the latter would imply a relatively complicated hardware and all the same give a limited capacity. Another disadvantage with basing schemes for data storage on the M state of the bacteriorhodopsin is the time delay which is inherent in the photocycle, corresponding to a delay of typically 100 µs from when the ground state bR for instance is excited with a light pulse and till the M state is reached.

Attempts have also been made to develop suitable media for optical data storage by modifying the light-sensitive material such that it undergoes an irreversible change when illuminated at a suitable wavelength. Such materials may make a simple write operation possible followed by an arbitrary number of read operations, but cannot be erased and written once more. They will hence be able to realise optical memories of the types ROM and WROM, but not of the type "erasable".

Recently it has been proposed, as it is evident from the above-mentioned article by Birge, to base schemes for optical date storage on a branching process in the photocycle of the bacteriorhodopsin. With starting point in the ground state bR a short pulse of yellow/green light initiates the photocycle, whereafter the bacteriorhodopsin spontaneously undergoes a sequence of states in the photocycle and reaches the O state after approximately 6 ms. If the bacteriorhodopsin is kept in the dark, it returns to the bR state after a few milliseconds, the exact time scale being dependent on temperature. If the bacteriorhodopsin, however, is illuminated with red light when it is in the O state, it will transfer to the P state wherefrom it spontaneously goes over to the Q state in the course of some minutes. The Q state is stable over long periods of time, even several years if it is kept in the dark. When it is irradiated with blue light, it will, however, return to the bR state.

It will be immediate evident that this branching process in the photocycle of the bacteriorhodopsin will furnish possibilities of write, read and erase operations in bacteriorhodopsin-based memories which may keep the stored information over long periods of time. International published application WO96/21228 (Birge) with the title "Branched photocycle optical memory device" discloses for instance a volumetric optical memory which stores information with high density in three dimensions by selectively activating a photochemical branching reaction from a short-term thermal intermediate state in the primary photocycle in a light-sensitive protein-based storage medium. In that connection a so-called "paging" laser which activates a selected plane layer or page of the storage medium in one wavelength are used as well as data lasers which emit selected data beams on another wavelength and which are orthogonal to the chosen layer or page. In a preferred embodiment the medium is disclosed as bacteriorhodopsin and the paging beam initiates a photocycle from the ground state or rest state bR and to an intermediate state of O, where the data beam interacts with the O intermediate state such that branching states P and Q are formed. The data beams do not to any great extent interact with either bR or P or Q. A differential reading operation uses the same wavelength for paging and data.

If bacteriorhodopsin is used in the device according to WO96/21228, the photocycle is initiated in the ground state bR by the use of short term yellow/green light pulse and the bacteriorhodopsin will thereafter go through a number of states in the photocycle and reach the O state after approximately 6 ms. If now the bacteriorhodopsin is not further illuminated, the O state will go back to the ground state bR after a few ms, the exact time scale being dependent on the temperature. If it is illuminated with red light in the O state, the bacteriorhodopsin, however, will branch to the P state wherefrom it spontaneously goes over to the Q state in the course of a few minutes. The Q state is stable over long periods of time, possibly many years if the bacteriorhodopsin is not illuminated. If, however, it is illuminated in blue light the bacteriorhodopsin goes back to the ground state bR. In the method for implementing the storage of data in accordance to WO96/21228 a volume element within for instance a cube-shaped body which comprises bacteriorhodopsin is selected by a specially structured illumination of the volume element with yellow or green light. The bacteriorhodopsin molecules in the illuminated volume element hence go through the photocycle and will transfer to the P state if they thereafter is illuminated with the red light. Typically the light is focused such that a thin plate-like light beam is generated and defines a sheet or a data page of bacteriorhodopsin in the body. This section gives a sheet with memory positions wherein a data page may be written and read separately from the bacteriorhodopsin in volume elements which have not been subjected to yellow or green paging light. In this way it becomes possible to store data in a three-dimensional bacteriorhodopsin body.

The above-mentioned method, however, is not simple to implement in practical data storage devices and has some substantial weaknesses. In order to achieve high volumetric data density the paging light must be very intense and uniform within a very closely defined spatial area with a sharp intensity limit. This implies the use of a laser beam and relatively complicated optics in order to form the beam. Secondly, it is necessary with a very precisely controlled illumination sequence which comprises the use of three separate wavelengths. The optimal timing of the sequence is temperature-dependent. Thirdly, write and read speeds are limited by the time constants of the photocycle, which lead to access times in millisecond range. Fourthly, the reading of the stored data will reduce the contrast of these, such that it becomes necessary with a refresh after a certain number, for instance 1000 read operations.

From NO Patent Application No. 980407, deriving from PCT/NO97/00154 which derives its priority from NO Patent Application No. 962475 which belongs to the present applicant and hereby is included as reference, there is known an optical logic element, particularly a multistate metastable logic element which comprises an optical memory material which under influence of an electromagnetic or electric field or supplied energy can transfer from a physical or chemical state to another physical or chemical state. The memory material in this optical logic element is provided in the form of a first layer and adjacent to this layer an activator which supplies energy to the memory material is provided. The activator may be in the form of a second layer adjacent to the first layer or provided integrated in the first layer. An optical detector which detects the state of the memory material is for instance provided in form of a third layer adjacent to the first layer, such that the optical Ionic element forms one of substantially three layers integrated component. The optical logic element may function as a single data storing cell or a bistable optical switch. The activator which causes a state change in the memory material is formed by one or more directly or indirectly radiation emitting means which may be accessed and addressed electrically. Preferably the radiation emitting means is a light emitting diode and particularly a polymer diode. Optionally the radiation emitting means also may be semiconductor laser. The way the optical logic element is disclosed in NO patent application No. 980407 it has been made proximity-addressable, i.e. the activation of the memory material and detection of its state of change takes place within the optical logic element itself and adjacent to the memory material, such that the use of complicated external optics in order to guide light into the memory material is not necessary. The optical logic elements according to this patent application can further be combined in planar structures into an integrated optical logic device and these planar structures may again be stacked, such that a true volumetric optical logic device is provided, comprising a great number of optical logic elements which all may be individually addressed in proximity. The realisation of the optical logic element with proximity addressing has as a consequence that they may be realised with dimensions which are far below for instance the size of storage cells implemented in known semiconductor technology or optical storage cells which are addressed by means of light provided from the outside over optically active structures such as refractive and diffractive elements which in themselves imply that the dimensions of the storage cell, i.e. the optical logic element, will be limited by the wavelength of the light used.

As mentioned above, there may according to NO patent application No. 980407 for the proximity addressing be used radiation-emitting means in the form of light emitting polymer diodes. Such light emitting polymer diodes is disclosed in international published patent application WO95/31515 with the title: "Colour source and method for its fabrication" which has been assigned to the present applicant and which hereby is incorporated by reference. Such light emitting polymer diodes may emit light of several wavelengths by varying the drive voltage of the diodes. The diodes may emit light of different wavelengths, for instance substantially red with a low drive voltage and blue with a higher drive voltage, while intermediate voltages may give an emission peak in both red and blue with varying intensities. The diodes have been made as a thin polymer film and with a thickness of about 10 nm and with an extension of the individual diodes which is not substantially larger. Integrated as radiation emitting means in an optical logic element they will hence be compatible with optical logic elements of a corresponding size.

BRIEF SUMMARY OF THE INVENTION

It is now with basis in the above-mentioned prior art a first object of the present invention to provide an optical logic element which gives an essential simplification of the addressing operations.

It is a second object of the present invention to provide an optical logic element wherein the addressing operations may be realised as proximity addressing for writing, reading, storing, switching or erasing of the information stored in the optical logic element.

A third object of the present invention is that information carrying state of the optical logical state of the element shall be unchanged for a very long period of time, such that data may be stored for several years without being lost and without the necessity of any refresh.

A fourth object of the present invention is that particularly the write and read operation and addressing shall take place very fast and without their being essentially influenced by thermally controlled time constants in the photocycle of the light-sensitive material used.

A fifth object of the present invention is that the reading of data shall take place non-destructively, i.e that the refresh of the state which represents the output datum in the optical logic element, is not necessary.

A sixth object of the present invention is that data shall be written and read in the optical logic element with very compact and low-priced write/read devices which consume little power.

A seventh object of the present invention is that optical logic element shall be miniaturised such that there may be achieved very high spatial as well as volumetric data storage densities in data storing devices based on the use of such optical logic elements and wherein the addressing shall take place by a simple proximity procedure.

Further objects of the present invention are the realisation of logical operations in this films of light-sensitive organic material which may undergo a photocycle, for instance bacteriorhodopsin and bacteriorhodopsin-like materials.

Finally there is also an object of the present invention to provide an optical logic element which is non-volatile, which may be combined in an optical logical device with possibility for a high-capacity parallel addressing and which may be driven in a problem-free cyclic operation and in addition be made with very low cost.

These above-mentioned and other objects and advantages are realised according to the invention with an optical logic element which is characterized in that the logic element initially and before an addressing is in a metastable state generated in advance, or with a proximity-addressable optical logic element of the same kind which according to the invention besides is characterized in that the light-sensitive organic material is provided in a substantially film-like structure or as a film-like structure, and that adjacent to or in this structure at least a colour-light source has been provided for optical addressing of the light-sensitive organic material and at least one colour-sensitive optical detector for detection of the physical/logic state of the light-sensitive organic material.

Advantageously the light-sensitive material according to the invention is molecules of protein or a protein-like compound, and even more advantageously the protein is bacteriorhodopsin or a related compound.

Further, according to the invention the initial metastable state advantageously is the M-state of the bacteriorhodopsin or the Q-state of the bacteriorhodopsin. There is according to the invention also advantageous that the colour light source is a wavelength-tuneable light source, and even more advantageous that the wavelength-tuneable light source is a light emitting polymer diode, the wavelength tuning taking place by controlling the drive voltage of the diode. According to the invention the colour-sensitive optical detector advantageously may be a multispectral, optical detector. It is also advantageous when according to the invention the colour-sensitive optical detector is a light absorbing polymer diode. If more than one colour-sensitive optical detector is provided, it is advantageous that the detectors are tuned to wavelengths or bandwidths which respectively correspond to the excitation wavelength or the absorption band of the ground state and one or more metastable states of the photocycle.

A method for preparation of a light-sensitive organic material is according to the present invention is characterized by irradiating the light-sensitive organic material in the ground state with light of a power bandwidth or wavelength which initiates a photocycle and generates a desired initial metastable state in the photocycle, said initial metastable state being assigned a determined logic value for the logic element.

Where the light sensitive organic material is bacteriorhodopsin, according to the invention the M state of the bacteriorhodopsin or the Q state of the bacteriorhodopsin is advantageously generated as the desired initial metastable state.

A method for optical addressing of an optical logic element is according to the present invention characterized in that the step for writing and storing comprises causing a transition from the initial metastable state to another metastable state or to the ground state if the logical value assigned in the former state is to be changed into a logical value assigned to the other metastable state or the ground state, and in the opposite case keeping initial the metastable state unchanged, that the step for reading comprises detecting the actual state of the optical logic element's actual state in order to determine the assigned logical value, that the step for erasing comprises causing a transition from the ground state if the optical logic element is in this state, by once more initiating a photocycle which switches the optical logic element back to the metastable state or, if the optical logic element already is in the initial metastable state, keeping the latter unchanged, or causing a transition from another metastable state if the optical logic element is in this state and back to the initial metastable state, either first back to the ground state for thereafter to initiate a photocycle which switches the optical logic element back to the initial metastable state, or, without passing through the ground state, directly to the initial metastable state, and that the step for switching comprises causing a transition from a present state to another state with a simultaneous or immediately following detection of the other state.

According to the invention the multistable optical logic element and the method for its addressing are employed in an optical logic device for storing and processing of data.

BRIEF DESCRIPTION OF THE DRAWINGS

The invention shall now be described in more detail by means of examples of embodiments and with reference to the accompanying drawing wherein FIGS. 1a, b, c schematically show the photocycle of a light-sensitive organic material, in this case bacteriorhodopsin, FIG. 2 the electronic absorption spectra of the bacteriorhodopsin for different states in its photocycle, FIG. 3 a proximity-addressable optical logic element according to the present invention, FIGS. 4a, b, c electroluminensce spectra for a light-emitting polymer diode as used in the present invention, FIG. 5 the light emitting domains in a light emitting polymer diode as used in the present invention, FIG. 6 schematically the preparation of the light-sensitive organic material and the photocycle which generates a desired metastable state, FIG. 7 schematically the preparation of the light-sensitive organic material and the photocycle which generates another desired metastable state, FIG. 8 schematically a first embodiment of a method for optical addressing according to the invention, wherein the light-sensitive organic material is bacteriorhodopsin, FIG. 8a showing the step for writing and storing, FIG. 8b the step for reading, FIG. 8c the step for erasing, FIG. 9 schematically another embodiment of the method for optical addressing wherein the light-sensitive organic material is bacteriorhodopsin, FIG. 9a showing the step for writing and storing, FIG. 9b the step for reading, FIG. 9c the step for erasing, FIG. 10 schematically different embodiments of the step for switching in accordance with the present invention, wherein the light-sensitive organic material is bacteriorhodopsin, FIG. 10a showing a first switching operation, FIG. 10b a second switching operation, FIG. 10c a third switching operation, FIG. 10d a fourth switching operation, FIG. 11 a preferred embodiments of an optical logic element wherein the present invention is employed, FIGS. 12a, b another preferred embodiment of an optical logical device wherein features of the present invention are employed.

DETAILED DESCRIPTION OF THE INVENTION

Figure 1A:
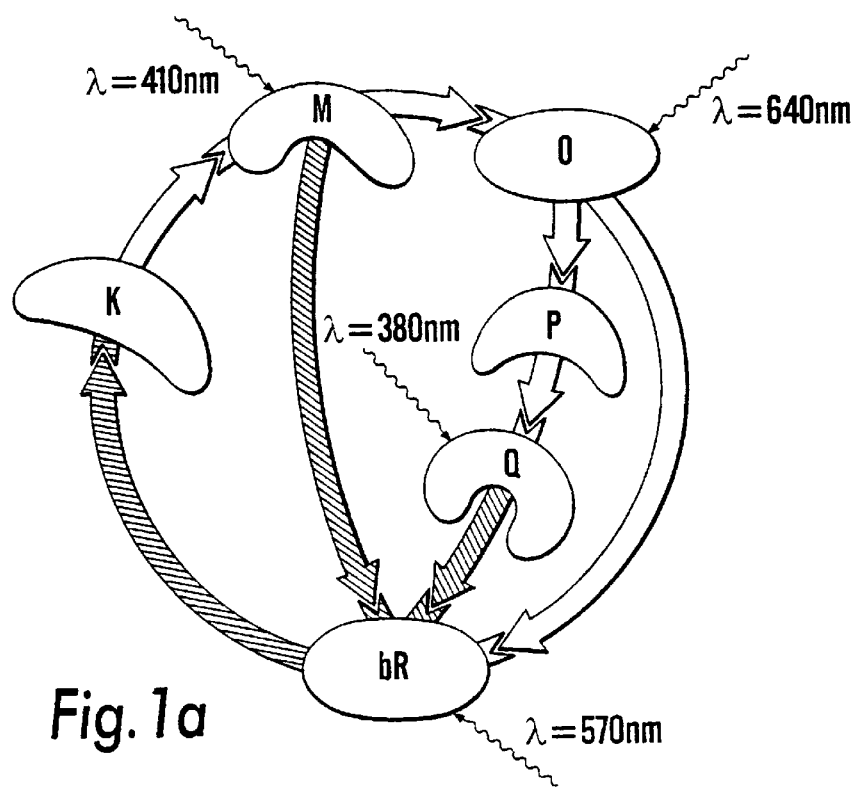

There are known several light-sensitive organic materials which all have the property that they may undergo a photocycle by irradiation with light of different wavelengths. Photochromic organic material based on fulgide or fulgide derivatives will for instance undergo a photocycle from an unbleached to a coloured state and back by irradiation with light on absorption wavelengths for the bleached and the coloured state respectively (Kirkby & al., Optical nonlinearity and bistability in photochromic thin films, Optics Communications, 56,4, pp. 288–292 (1985)), For holographic data registration there has been proposed to use photochromic dye systems based on polymers doped in photochromic spirooxazin or spiropyran dye which form stable and colourless forms by photochemical transitions generated with light on a respective excitation wavelength (Weiss & al., Holographic recording and all-optical modulation in photochromic polymers, Optics Letters 18,3, pp. 1089–1091 (1993)).

Particularly, however, the optical logic element according to the invention is intended for use with molecules of protein or a protein-like compound and as examples of these the chlorophyl protein complex and the retinal protein complex may be mentioned (Bazhenor & al., Biopolymers for Real-Time Optical Processing, Optical Processing and Computing, Academic Press pp. 103–144 (1989)).

Bacteriorhodopsin belongs to the retinal protein complex and has been used in form of membranes in matrices of polymer, as membranes on glass substrate or as low temperature membranes. At the temperature of liquid nitrogen the thermal reactions of the photocycle are inhibited and the photocycle comprises only the ground state bR and the intermediate state K which is stable at this temperature. The photochemical time constant for transitions from bR to K is about 10 ps and by irradiation with red light (600 nm wavelength) the bacteriorhodopsin returns to the ground state bR. At the temperature of $-50°$ C. this photocycle will be interrupted by the M state and therefrom the bacteriorhodopsin molecules can return to the bR state by irradiation with light on 410 nm wavelength (ibid. p. 120).

It is according to the present invention particularly preferred that the protein is bacteriorhodopsin or related compound. Bacteriorhodopsin and its mutants or chemical modifications is the compounds which at the time being are the most thoroughly investigated with the intention of optical storage of data. The following discussion of embodiments of the optical logic element and methods according to the invention will hence specifically be directed towards embodiments which are based on bacteriorhodopsin or its mutants and chemical modifications as well as the photocycle of the bacteriorhodopsin.

Bacteriorhodopsin is a light-collecting protein in the purple-coloured membrane of a micro-organism which formally is known as Halobacterium salinarium of usually as Halobacterium halobium. Bacteriorhodopsin has a molecular weight of 26 000. Halobacterium salinarium grows in salt marshes where the salt concentration is about six times higher than that of seawater. The purple-coloured membrane is formed by the bacterium when the oxygen concentration becomes too low to support the respiration. By absorption of light the protein pumps a proton over the membrane and generates a chemical osmotic potential which serves as an alternative energy source. The fact that the bacteriorhodopsin must survive in an environment as hostile as a salt marsh where the temperature may exceed 65° C. for long periods of time, requires a robust protein which will withstand thermal and photochemical stresses. Experiments suggest that bacteriorhodopsin may withstand temperatures as high as 140° C. and in any case normally withstand 80° C. The cyclicity of the protein, i.e. the number of times it may go through a photochemical cycle exceeds $10^6$, a value which is substantially higher than the most of the synthetic photochromic materials. Bacteriorhodopsin hence is well suited for a technical application such as an optical logic element according to the present invention and is, although it is basically a biologic material, able to provide a long-term stable data storage medium.

When bacteriorhodopsin absorbs lights, it undergoes a photocycle which generates intermediate states with absorption maxima in the whole visual range of the electromagnetic spectrum. Schematically this is shown in FIG. 1a which illustrates the bacteriorhodopsin photocycle and suggests a sequence of special transformations which are induced by the light. Light induced transitions or excitation transition are denoted with shaded arrows, while unshaded arrows denotes transitions due to thermal relaxation. Green light transforms the ground state bR of bacteriorhodopsin into an intermediate state K which thereafter relaxes and forms the M state and thereafter the O state. The residence time in the M state depends amongst others on both temperature and the mutant of bacteriorhodopsin used. If bacteriorhodopsin in the O state is subjected to red light, a so-called branching reaction takes place. The O state transfers to the P state which quickly relaxes to the Q state, a form of the bacteriorhodopsin which has shown to be stable over a very long period of time. In the different mutants of bacteriorhodopsin which use aspartic acid residues 85 and 96, the lifetime of the Q state may extend to several years. If aspartic acid 85 is replaced by a non-polar amino acid such as aspargine, the formation of a stable M state is inhibited and the primary photocycle forms the O state (or an intermediate state very much like the O state) very quickly (R. R. Birge, Ann. Rev. Phys. Chem, 41, pp. 683–733 (1990)). However, if the bacteriorhodopsin in the Q state is irradiated with blue light, it returns to the ground state bR. If the O state is not irradiated with red light, it will in a short time relax back to the ground state bR. Any of two states with long lifetime may now be assigned a binary logic value 0 or 1 and hence it becomes possible to store information in bacteriorhodopsin molecules which are in one or the other of these states.

Figure 1B:
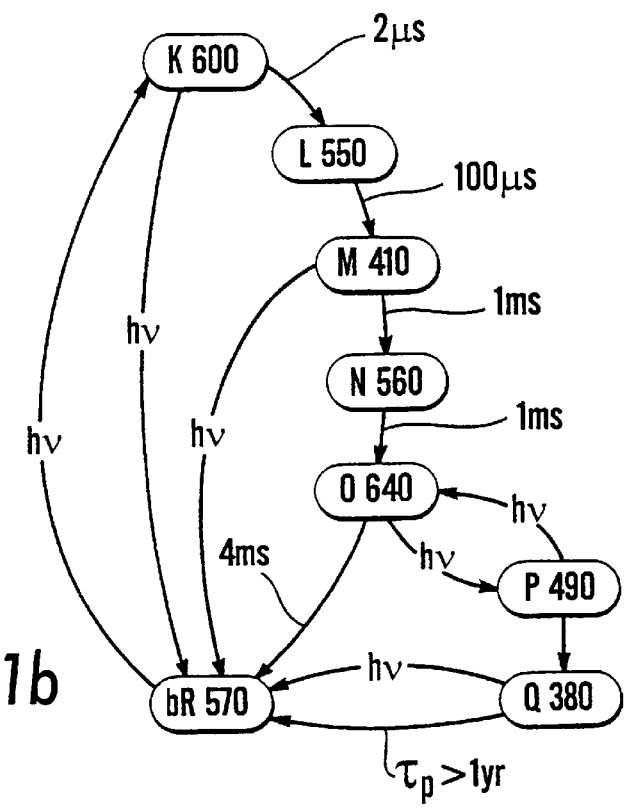

FIG. 1b is a diagram of the primary photocycle of the bacteriorhodopsin. The central photochemical transformations which are relevant for use in the optical logic element according to the present invention, are shown in the diagram in a sequence which generally goes clockwise around the diagram. bR denotes the ground state of the bacteriorhodopsin and capital letters denotes different states of the photocycle. The numerals in parenthesis denote the centre wavelength of the absorption bands of the different states or species of bacteriorhodopsin in nanometers. Transitions which are caused by a photo-induced excitation are denoted with hv and possibly with time constants $t_v$, while transitions which are caused by thermal reactions are denoted with the time constant $t_p$ for first order relaxation times at about room temperature.

Illumination of bacteriorhodopsin molecules in the ground state or in the rest state bR with light centred around 570 nm generates the excitation state K which has a very short lifetime. As will be seen, the K state has an absorption bandwidth which is centered around 600 nm and this implies that if the power bandwidth by excitation by bR state stretches to over 600 nm, molecules in the K state will return to the ground-state bR. This transition has, however, supposedly a low quantum efficiency and as the K state is unstable and very quickly transfers to the L state, most of the molecules in the K state will be driven further in the photocycle, even though some molecules may cycle back to the ground state bR. The intermediate state M which has an absorption band centred around 410 nm, will within a short time span of 1–3 ms, relax thermally to the intermediate state N which again relaxes thermally into the intermediate state O. The M state may as mentioned have a relatively long lifetime in different modifications of bacteriorhodopsin, possibly up to several minutes and hence it could possibly be used to represent one of the logic states 0 or 1 if archival storage over very long spans of time is not required. It may here be mentioned that the M state in reality consists of two states $M_1$ and $M_2$ which have practically identical absorption spectra. It may be added that during previous attempts of holographic data storage in bacteriorhodopsin with the use of M state, a gradual loss of sensitivity and contrast was observed, something which later was shown to be caused by loss of active molecules by the branching reaction to the P and Q state (R. R. Birge, private communication, 1996). It will from the diagram be seen that the M state returns to the ground state by being irradiated with light centred around the absorption centre wavelength of 410 nm for the M state. Light centred about the absorption centre wavelength of the ground state bR, namely 570 nm, will however, of course not drive the M state back to the bR state. The O state has an absorption centre wavelength of 640 nm and will hence, if it is irradiated with light of a power bandwidth centered around this wavelength, such that a branching reaction is generated in the photocycle, transfer to an intermediate state P which has a relatively long lifetime, up to several minutes. The P state will thermally relax to the most stable of the photocycle intermediate states, namely the Q state which has a lifetime which probably extends up to several years. The Q state may hence be used to represent a logic state which shall be kept for years. In addition to the stable ground state bR, the Q state hence is the state that is best suited when bacteriorhodopsin shall be the storage medium in cases wherein an optical logic element according to the invention is to be used in an optical data storage device suited for archival storage.

If the Q state is irradiated with blue light with a power bandwidth centred on the Q state absorption wavelength of 380 nm, the Q state transfers to the ground state bR, while the arrow without time indication also indicates that the Q state will thermally relax to the ground state bR, but with a time constant which then is several years. The P state will by absorption of light with a power bandwidth centred around the P state's absorption frequency of 490 nm return to the O state. The O state besides relaxes thermally in the normal photocycle back to the ground state bR with a time constant of 4 ms at room temperature.

Figure 1C:
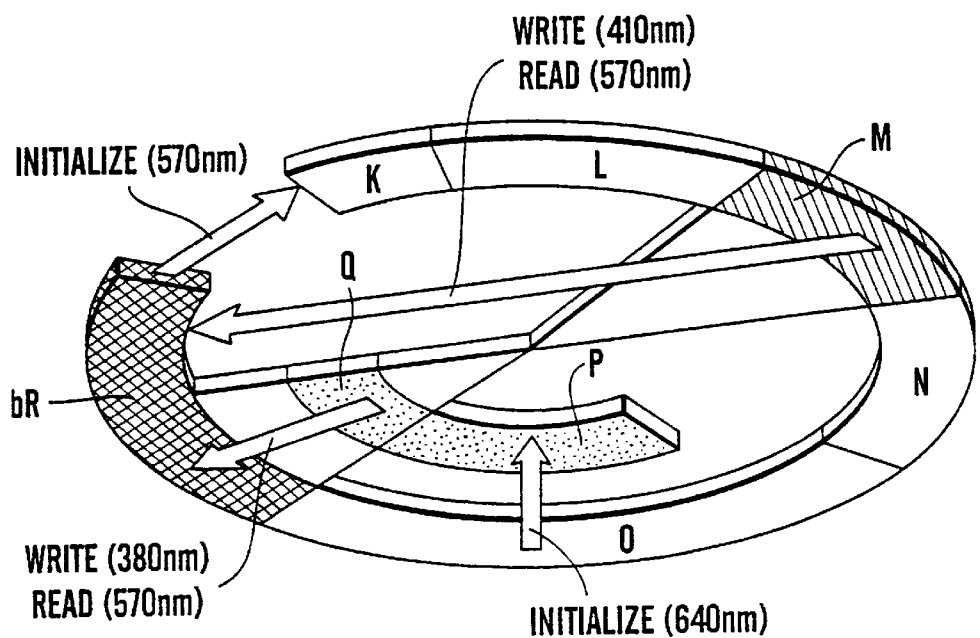

In order to further visualize the photocycle of bacteriorhodopsin, it is shown graphically in FIG. 1c. The outer circle represents the course of the photocycle clockwise, from the ground state bR and thereafter via intermediate states K, L, M, N and O back to the ground state bR. The branching reaction of the photocycle is represented by an inner circular arc with the P and Q states which are reached from the O state. Metastable states with comparatively long lifetimes, i.e. M, P, and Q, are shown shaded. A circle sector represents the area of the photocycle which comprises the states Q and bR which for the purpose of the invention are regarded as stable. Photo-induced transitions in the photocycle and being of importance in the present invention, are denoted by numbered arrows. In the diagram very shortlived intermediate states without importance for the invention are, however, left out. The same applies to the case wherein an intermediate state in reality is composed of several states with approximately identical absorption spectra.

Figure 2:
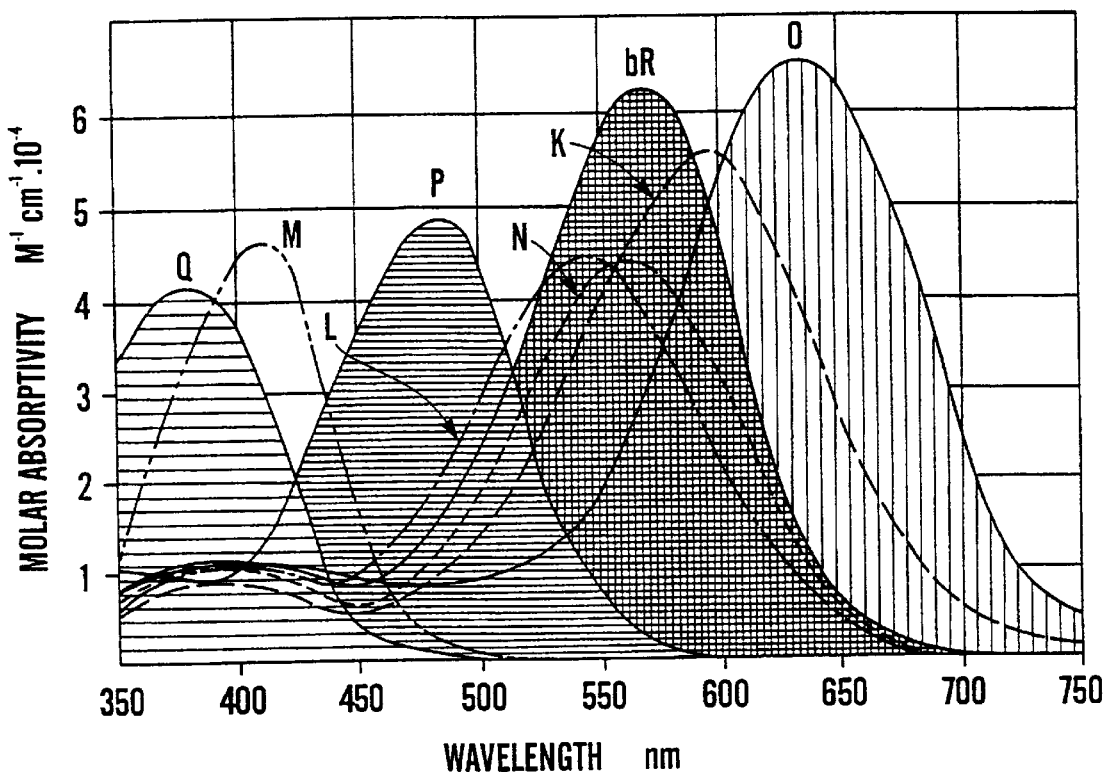

The absorption spectra of the different species or the states of the bacteriorhodopsin are shown in FIG. 2 which also gives an indication of suitable power bandwidths when irradiating a species in order to generate an excitation to another state. It will for instance be seen that use of a power bandwidth centred around 600 nm will generate the states N, bR, K and O, but the consequence of an irradiation of this kind will be that at least a significant fraction of the molecular population will be driven from bR and over to the relatively stable Q state. The same may of course be achieved by irradiating the ground state bR continuously with a light pulse centred at 570 nm, such that the bR state transfers to the O state and simultaneously continuously also illuminate the bacteriorhodopsin with light centered on 640 nm, optionally after a couple of milliseconds, such that the O state transfers to the P state. The implication of this shall be discussed more closely in the following. From FIG. 2 it will further be seen that the Q state effectively may be excited to the ground state bR by irradiating the molecules in the Q state with light at 380 nm or for instance a power bandwidth of 360–400 nm.

According to the invention the logic element initially and before an addressing shall be in a metastable state generated in advance. Preferably this initial metastable state for instance may be the M state of the bacteriorhodopsin which in this case shall have suitably long lifetime in order that it may represent one or two logic states 0 or 1 in a desired optical data storage scheme. More preferred however, is the initial metastable state the Q state of the bacteriorhodopsin, which as mentioned has a lifetime of many years.

The optical logic element wherein the light-sensitive material, in this case is bacteriorhodopsin, may be provided in a layer-like structure and is prepared beforehand for a specific application by irradiating the bacteriorhodopsin which are in the ground state bR with the yellow light of a power bandwidth which effectively causes their transition to the long-term stable Q state. The transition from the bR to the succeeding unstable K state in the photocycle has high quantum efficiency, while a photo-induced transition from the K state back to the bR state has a supposedly low quantum efficiency and in practice hence a substantial proportion of the molecules in the bR state successively will reach the O state. By using a power bandwidth which comprises both the absorption bands of the bR state and the O state, possibly by using light with wavelengths corresponding to the absorption center wavelength for respectively each of the two states, the O state will transfer to the P state which by thermal relaxation over several minutes transfers to the long-term stable or metastable state Q. The process is cumulative, i.e. that more and more molecules transfer to the Q state the longer the bacteriorhodopsin is illuminated with yellow light of suitable bandwidth or wavelengths. It then does not matter that the transition from the O state to the P state has low quantum efficiency, evidently about 0.01–0.02. However, with continuous illumination with yellow light in this way, the K state will also as mentioned simultaneously be excited back to the ground state bR with low quantum efficiency and the O state will thermally relax with a typical time constant of approximately 4 ms back to the bR state, but the photocycle then only circulates on and with increasing yield due to a cumulative effect. As the preparation of the light-sensitive material takes place long before the optical logic element must be introduced in an intended application, the bacteriorhodopsin in this way may be prepared and stored with a significant proportion of the molecule population in the Q state. In the preferred embodiment the Q state hence is one of the two in practice stable states which shall be used for representing either a logic 1 or a logic 0. Due to practical reasons it will in the following be supposed that the Q state represents logic 1 and the bR state logic 0.

The logic element hence before a write or read storage operation may practically be regarded in the Q state. Writing or storing of data in the logic element now very simply take place in the manner that if the logic value which is to be written or stored is 1, it is already represented in the logic element by the bacteriorhodopsin for this purpose substantially being in the Q state and hence has the logic value 1. If on the contrary it shall be written a logic 0 in the logic element, this now very simply takes place by the write or storage process being effected by illuminating the logic element, i.e. the bacteriorhodopsin with light centred on the absorption centre wavelength of the Q state, namely 380 nm and thus a blue light. The logic element hence transfers from the state 1 to state 0 and this state then will be permanently stored in the bacteriorhodopsin bR state. Hence the operations wherein the light-sensitive organic material, in this case bacteriorhodopsin, shall be used as a switchable or data storage medium in a logic element according to the invention, are simplified as a write or storage operation are reduced to irradiation with blue light on a determined wavelength and only if the already represented logical 1 shall be changed into logical 0. The operations in connection with the addressing of an optical logic element in accordance with the present invention shall, however, be discussed in greater detail in connection with the discussion of FIGS. 8, 9 and 10.

Figure 3:
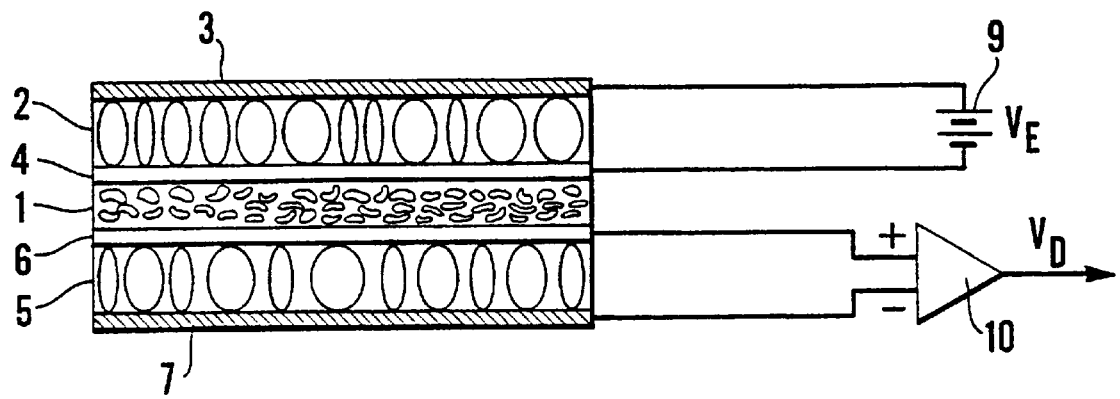

There shall now with reference to FIG. 3 be explained how the optical logic element according to the present invention may be realised as a proximity addressable optical logic element. Basically proximity addressable optical logic elements are known from NO patent application No. 980407 which previously has been referred to and which has been assigned to the present applicant.

FIG. 3 shows schematically the realisation of an optical logic element according to the present invention. The light-sensitive material, in this case bacteriorhodopsin, is provided in the form of a layer-like structure 1.

Adjacent to the light-sensitive material of the structure 1 an emitter or light source 2 is provided, preferably in the form of a light emitting polymer diode.

The light emitting polymer diode 2 is supplied with drive voltage $V_E$ via two electrodes 3, 4 which are connected to a current source 9. The light emitting polymer diode is provided adjacent to the light-sensitive material 1, in this case bacteriorhodopsin which shall be driven in a photocycle.

This implies that the electrode 3 must be transparent. Further the light emitting diode 2 for driving the bacteriorhodopsin through the photocycle must voltage tuneable which implies that in the present case it will be relevant to realise the light emitting diode in the form of voltage tuneable polymer diodes of the kind that for instance is disclosed in the above-mentioned international patent application WO95/31515 and in relation to this reference discussed in somewhat greater detail. Opposite of the light emitting diode 2 and likewise adjacent to the structure 1 of the bacteriorhodopsin a photovoltaic or a photoconductive detector is provided, also preferable in the form of a layer-like structure and it is provided with electrodes 6, 7 which conducts the signal voltage $V_D$ output by the detector on the detection of light to a not shown detector amplifier 10. Evidently also here the detector electrode 6 which is facing the bacteriorhodopsin structure 1 must be transparent.

Figure 5:
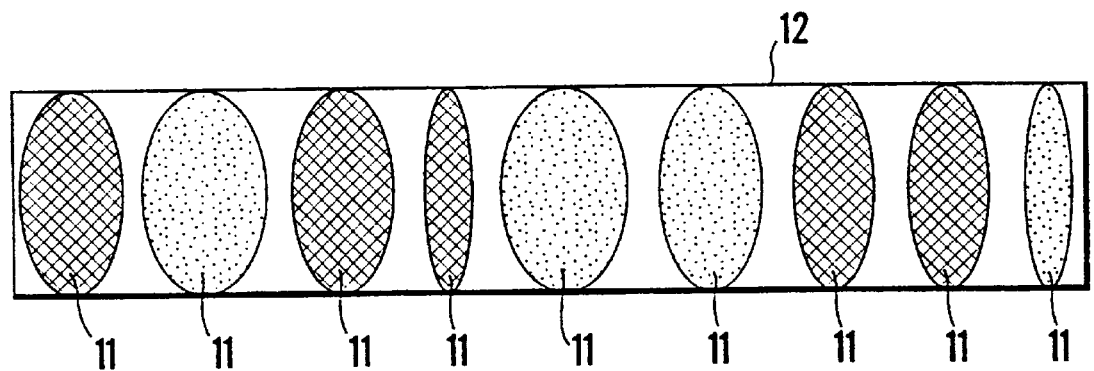
Figure 4A:
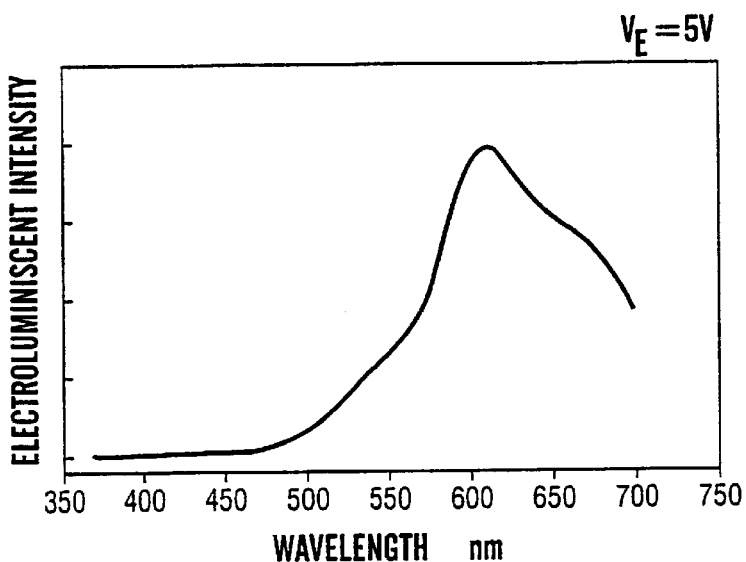
Figure 4B:
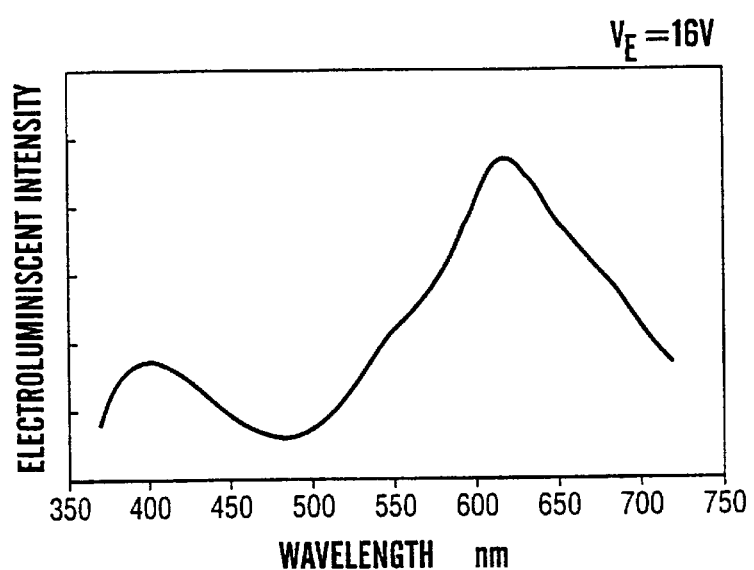
Figure 4C:
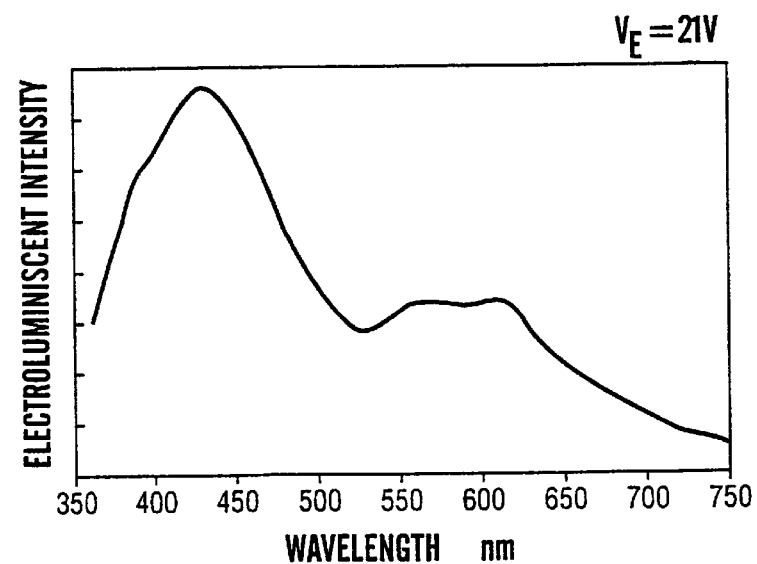

The voltage tuneable colour light sources in the form of light-emitting polymer diodes are as already discussed with reference to the above-mentioned international patent application WO95/31515 and are also further disclosed in more detail by M. Bergren & al., Nature 372, pp. 444–446 (1994). By varying the drive voltage $V_E$ applied over the electrodes such light emitting polymer diodes will emit light on different wavelengths. The shown concepts for the light emitting polymer diodes of this kind are relatively general and the spectral characteristics of the emitted light radiation may be controlled within wide limits by a suitable choice of the light emitting material. With the present disclosure in mind, where it is desirable with a spectral adaptation to the light absorbing properties of bacteriorhodopsin in the different states, it shall be supposed that the light emitting polymer diode emits yellow light at low voltage $V_E$ and with increasing emission of blue light as the voltage increases. This is shown in more detail in FIGS. 4a–c, wherein FIG. 4a shows the spectral characteristics and intensity at an applied voltage of $V_E$ of 5 volt. The emission substantially takes place in the form of red light with a spectral peak of approximately 630 nm. The power factor is here 100%. In FIG. 4b the voltage is increased to 16 volt and the power factor reduced to 50%. It will be seen that the light emitting polymer diode still retains the emission peak at about 630 nm, but simultaneously obtains an increasing emission of blue light of about 400 nm. At an applied voltage of 21 volt with a power factor of 20% the emission at wavelengths over 530 nm is reduced and there is substantially obtained an emission peak of blue light with high intensity and centred at 430 nm. The voltage controlled emitter 2, that is the light emitting polymer diode as disclosed in the above-mentioned international patent application WO95/31515, comprises a number of physically separated light emitting domains 11, such this is shown in FIG. 5 which may be regarded as a schematic section to the emitter layer. The domains 11 are embedded in a transparent matrix 12 which for instance itself may be a polymer and each domain contains only one type of light-emitting polymer, i.e. either with a narrow band gap which emits mainly in yellow or red or with a wide band gap which emits in blue. If the domains 11 were large and spaced apart at relatively great distance, this could cause problems due to unpredictable and irregular light emission from the light-emitting diode, and with some optical beam geometries in a bad spatial overlay between respectively red and blue light which fall on a given midpoint in the bacteriorhodopsin structure. Experimental investigations, cf. the above-mentioned WO95/31515, have shown that there at present at least is possible to achieve typical dimensions and distances between the domains in a range from a few 10 nm and up to a few 100 nm, such that the scale factor of the polymer layer or the thickness of the matrix 12 corresponds to the domain section, as the domains evidently must contact the electrodes 3, 4 on the surfaces of the matrix. Effects which are caused by spatial discretized light emission will hence be detectable with very small light-emitting polymer diodes, typical in the scale of a few nm. On the other hand there are also indications that the size of light emitting polymer diodes 2 may be reduced substantially by reducing the extent of the domains 11 such that possible disadvantageous spatially effects may be avoided even with an extent of the light emission diodes of 10 nm or thereabouts. The thickness of the emitter layer will then be comparable and it follows from this that at least in theory it will be possible to realise optical logic elements according to the present invention with an extent of at most some rim and a corresponding thickness.

The photovoltaic or photoconductive detector 5 is realised corresponding to the emitter 2 or the colour light source, namely by using corresponding polymer diodes and with the domains now as light absorbing, such that a detected variation in the light intensity spectrally dependent will generate the signal voltage or the output voltage VD of the detector on the electrodes. Likewise the detector 5 must in this case be tuned to the spectral properties of the emitter 2. Also for detector 5 the same scale factors as for the light emitting polymer diode 2 are obtained, the dimensions of the domains 8 determining the layer thickness, Evidently the layer thickness must be compatible with the domain section such that the contacting of the electrodes 6, 7 is achieved.

Figure 11:
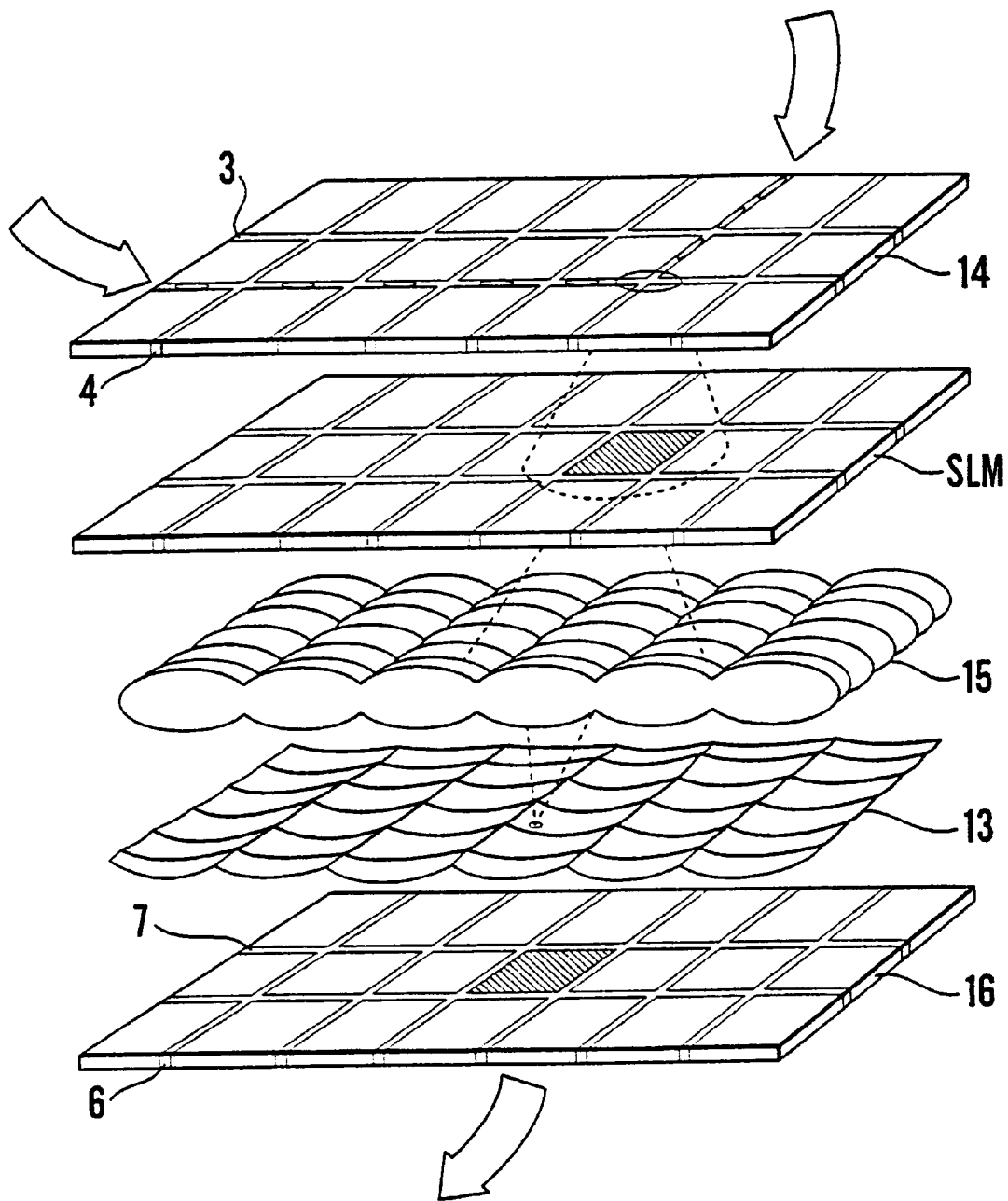

It will be seen that the optical logic element as disclosed herein, is realised as proximity-addressable and one avoids the constraints on the scale factors which would be present if light was guided to the light-sensitive organic material through optically active structures in the form of refractive or diffractive elements provided outside the bacteriorhodopsin structure and between this and the emitter. In that case the size of the optical logic element will be limited by the wavelength of the light radiation used.—An embodiment of an optical logical device wherein the optical logic elements are addressed through optically active structures in the form of small lenses, is also shown in FIG. 11 and shall be discussed below with reference to this figure.

Now the operation for the preparing, writing, reading and erasing shall be discussed in connection to the FIGS. 6–9 and under the supposition that the optical logic element shall be used for storage of data. All the FIGS. 6–9 show operations realised with four logic elements which have been drawn as an ellipsoid and repeatedly for each step in the relevant operation with indication of the actual state bR, M, Q.

Figure 6:
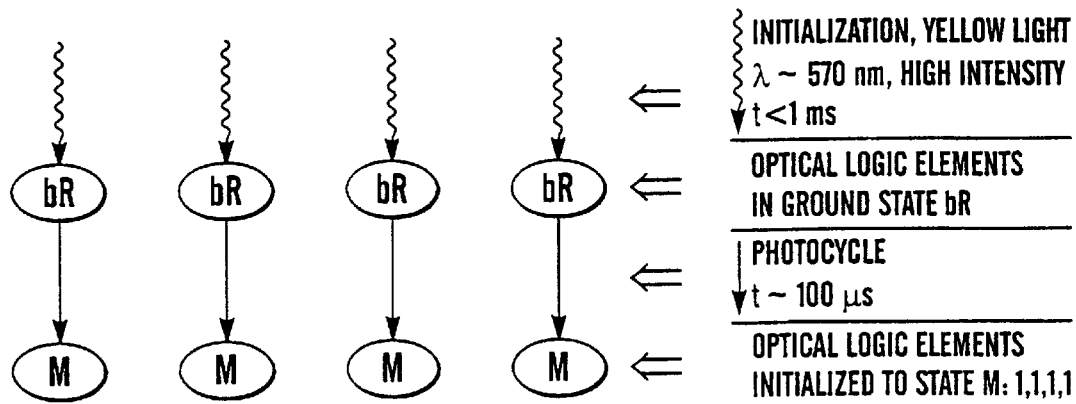

FIG. 6 shows the preparation of bacteriorhodopsin with use of the photocycle which generates the M state as the initial metastable state. If a mutant of the bacteriorhodopsin is chosen, the lifetime of the M state may be extended to several minutes. Writing takes place by irradiation with blue light ($\lambda$=approx. 410 nm), whereby the M state returns to the bR state. It is evident that the M state will be less suitable for archival storage, but wherein data shall be stored in short time spans or in volatile memories, the M state may advantageously be the initial state and represent logic 1, possibly 0. Further it is an advantage that the M state as initial state makes possible a fast erasing and a reset, as the cycle time M→bR→M at most is somewhat larger than 100 $\mu$s at room temperature.

Figure 7:
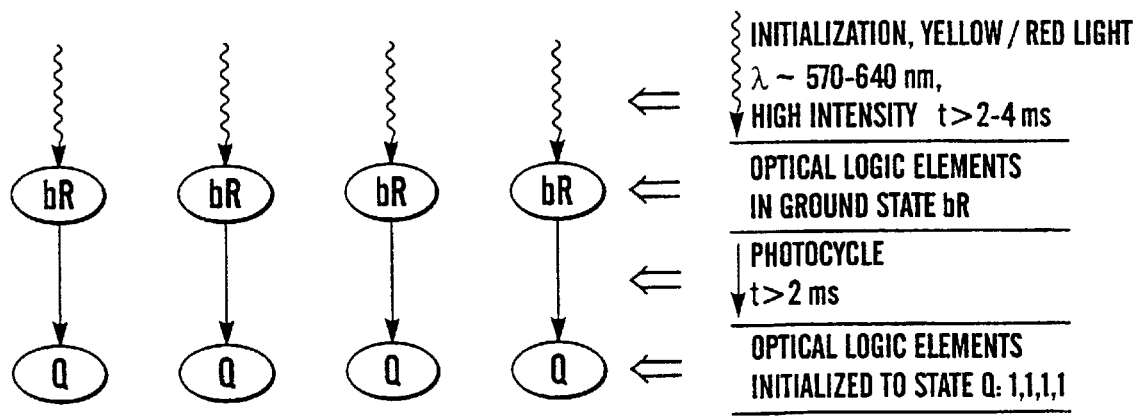
Figure 8A:
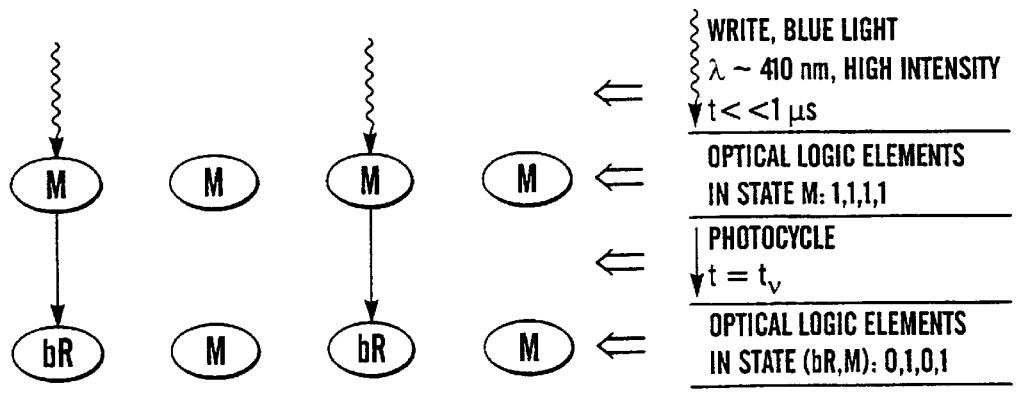
Figure 8B:
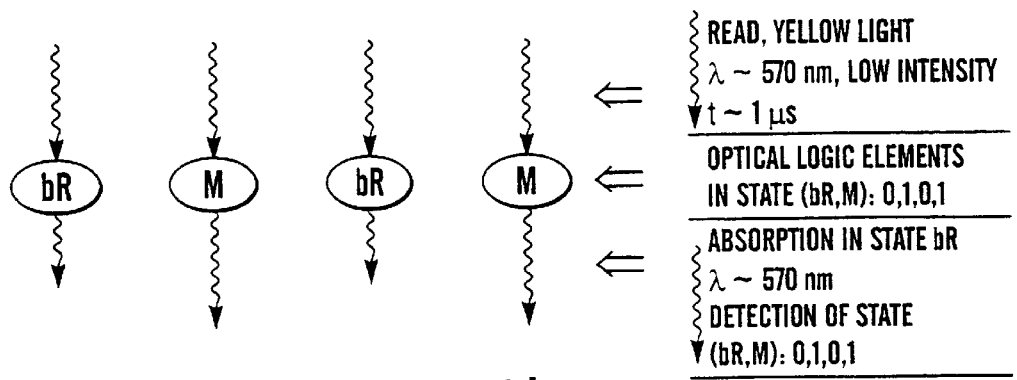
Figure 8C:
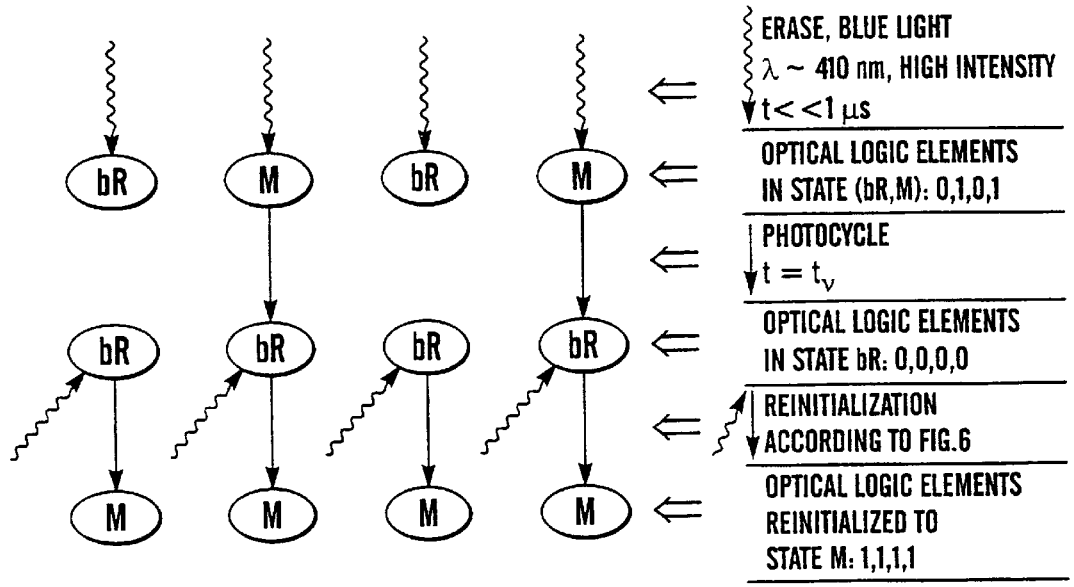

FIGS. 8a–c show respectively the steps for writing/storing, reading and erasing, wherein the initial metastable state is the M state and should in regard of what has been said in the general part of the description hardly need further explanation. If long-term stable storage of data in the bacteriorhodopsin structure is desirable, the bacteriorhodopsin will beforehand be prepared with yellow light ($\lambda$=approx. 380 nm) and initialised to the Q state, as this is shown in FIG. 7.

Figure 9A:
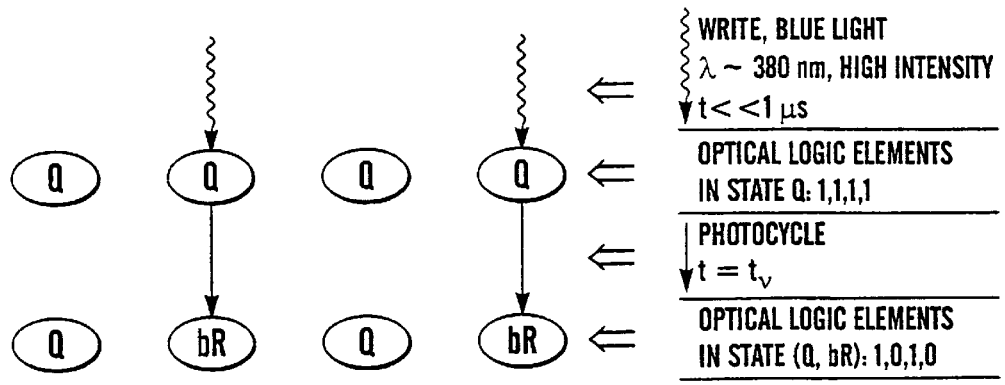
Figure 9B:
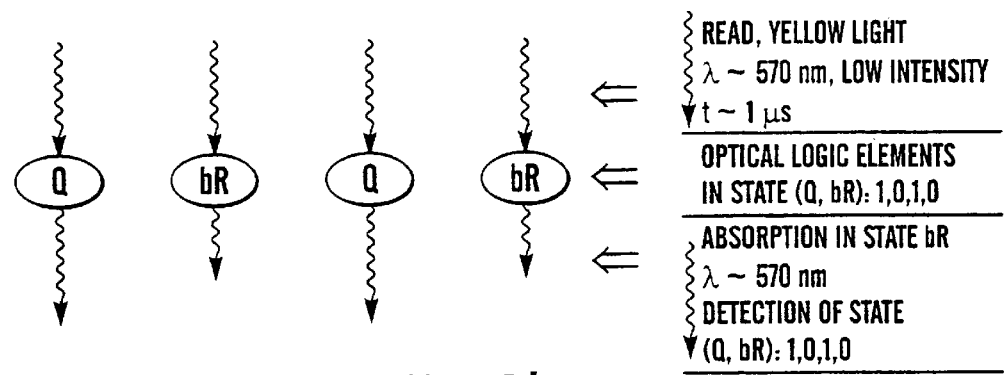

Initially the bacteriorhodopsin structure now is in Q state. Writing takes place as shown in FIG. 9a by the emitters or the light-sensitive organic diodes being supplied with a voltage which is high enough that blue light is emitted and brings the bacteriorhodopsin structure at the illuminated spot to the bR state. Reading takes place as shown in FIG. 9b by applying a low voltage to the emitter making the light emitting diodes emit yellow light. Dependent on whether the bacteriorhodopsin structure is in the bR- or the Q state, the yellow light will be absorbed in a greater of lesser degree. Thus by measuring the signal voltage output by the detector, the logical state of the bacteriorhodopsin structure can be determined.

Figure 9C:
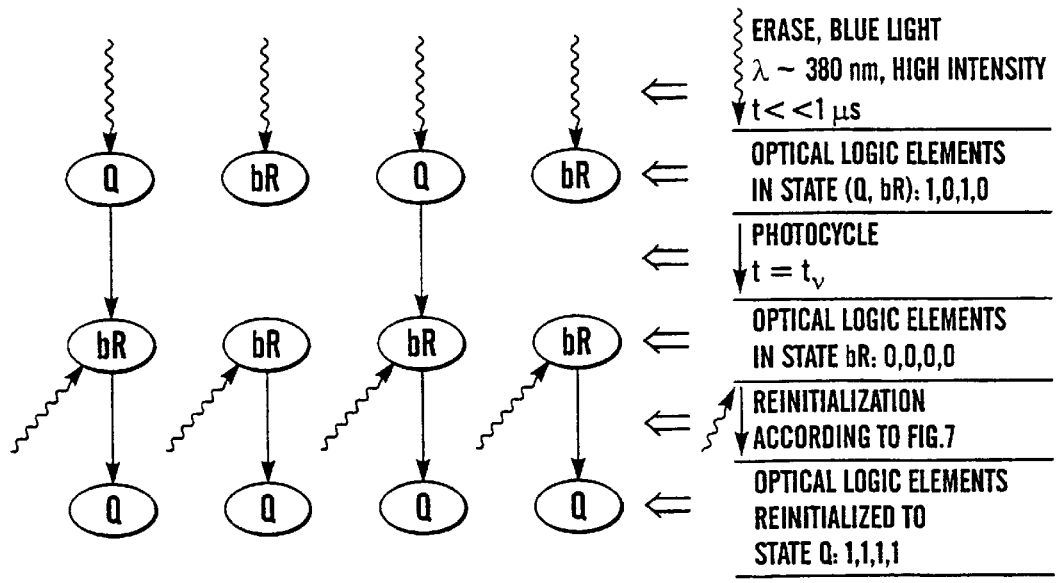

As soon as the bacteriorhodopsin structure has transferred from the Q to the bR state, it may as shown in FIG. 9c be returned to the Q state by irradiation with light on a wavelength which interacts with the bR and O states simultaneously, which corresponds to a reset or erase operation. If the optical logic element is to be used in an optical logical device in the form of a data storage device of the ROM or WROM type and with the use of an emitter which may emit light irradiation with two colours, for instance a voltage tuneable organic light emitting diode, the write and read operations takes place as follows.

Basically it shall once more be supposed that the bacteriorhodopsin structure is factory prepared in the Q state, i.e. that the logic element initially before addressing is in a metastable state generated in advance. In this Q state it may remain for several years unless it is irradiated with blue light. Further it is as elsewhere supposed that the Q state of the bacteriorhodopsin molecules is defined as the logic 1. Irradiation with blue light transfers the bacteriorhodopsin molecules from the Q state to the ground state bR which represents the logic 0 and writing now takes place by changing the initial Q state into the bR state. The emitter is activated with a short-lived voltage pulse on high level, such that the mixture of blue and yellow light irradiates the bacteriorhodopsin structure. The yellow spectral component does not change the logic state of the bacteriorhodopsin molecules. Yellow light absorbed by the molecules in the bR state initiates the photocycle, but a branching of the P and Q state does not take place, as the duration of the light pulse is supposed to be less than the cycle time which is necessary to reach the O state. Even with relatively long light pulse durations, the spectral components in yellow will be too weak and inefficient to drive a significant fraction of the molecules in the O state over to the P state. The spectral component in blue is mainly absorbed by molecules in the M- and Q states, such that both these transfer to the bR state. The transition from the Q to the bR state is the write operation, i.e. a change from the logic state 1 to a logic state 0.

Reading takes place by activating the emitter with a short duration voltage pulse on low level, such that only yellow light irradiates the bacteriorhodopsin structure. Dependent on the relative population of molecules in the bR state in the bacteriorhodopsin structure, a larger or lesser part of the light goes through the structure and is detected by the underlying detector element. Low transmission through the bacteriorhodopsin structure implies that a large population of the molecules therein is in the bR state or the logic state 0, while a large population in the Q state which absorbs spectral components in blue, gives a better transmission of yellow light and corresponds to the logic state 1. As discussed herein this implies a WORM-scheme, i.e. data may only be written once and thereafter read a great number of times. Writing may also take place at the production location for WORM-applications. The above-mentioned schemes for writing and reading may be straightforward extended such that there is obtained a possibility for erasing and writing of data once more. Once again it shall be supposed that writing, reading and erasing are based on the use of proximity addressing of the bacteriorhodopsin structure with a voltage tuneable emitter which emits in two spectral ranges, i.e. a two-colour emitter.

A closer scrutiny of the photocycle in FIG. 1 shows that a constant irradiation near the isobestic point of 600 nm for absorption in bR and O state will make the Q state to function as a receiver. Absorption of light at 600 nm by the molecules in the bR state initiates the photocycle, as the molecules at each point in this is irradiated with light at 600 nm wavelength. Only two of the transient states of the photocycle have a significant absorption at 600 nm, namely the K and the O states. The molecules in the K state will absorb some light and return to the bR state, such that there will be an undesirable return reaction by the transfer of molecules from the bR to the Q state. The residence time in the K state is, however, as short as two microseconds and hence significantly shorter than the O state which has a residence time of several milliseconds, but wherein the molar absorbtivity on the relevant wavelength is comparable to that of the K state. The molecules which transfers from the O to the P state under influence of irradiation with light at wavelength 600 nm, finally ends up in the Q state, while the remaining part returns to the bR state.

If the illumination continues over sufficiently long time spans, the molecules which return to bR state will circulate repeatedly, as a fraction is branched to the P and the Q states in each cycle. During a sufficiently long period hence all molecules will end up in the Q state, given that the spontaneous transition rate from the Q state to the bR state is negligible.

The above-mentioned operations which are slow, but compatible with light sources of low intensity, may be compared with that which has been disclosed in the above-mentioned international patent application WO96/21228, wherein a yellow light pulse initiates a photocycle and a red pulse is used when the excited molecules reach the O state. In the latter case much higher speeds are reached, but simultaneously it is necessary to use light sources with high intensity and which emit at several wavelengths.

The relatively simple scheme with use of two wavelengths for reading and writing of data which has disclosed above will still be possible if the emitter is made such that it emits red light at about 600 nm wavelength at low voltages and red and blue light at higher voltages. Writing will now take place by high voltage pulsing and if the radiation time is sufficiently short, only blue light will influence the populations in non-transient states, i.e. by transferring molecules from the Q state to the bR state. Reading takes place by screening the bacteriorhodopsin structure with red light, i.e. with low voltage pulsing of the emitter. This will not affect the population in the Q and bR states if the irradiation time is sufficiently short. The spectral adaptation to the bR state is, however, now inferior, something which may influence the reading speed.

Deleting or erase/reset may be achieved by continuous illumination with red light, i.e. the emitter is supplied with low voltage over a certain time period. The necessary period depends on a number of factors, such as the desired population in the Q state, the optical architecture, the efficiency of the emitter, temperature and spectral adaptation, but takes generally much longer time than typical write and read operations. This is not necessarily any problem as in many applications the erasing/reset operation may take place disconnected or be subject to a management protocol whereby write/read operations are not disturbed.

Where the figure text to FIGS. 6–9 states that the irradiation takes place with light of high intensity, this is to be understood that if the operation has a critical time factor i.e. is constrained by a given time constant, the irradiation alternatively also may take place with light of relatively low intensity, but over a longer time period.

It is also wholly possible to use the optical logic element according to the invention not only for storing of data, but also in the form of an elementary logic cell which may be switched from one state to another and possibly reset to 0, as such elementary logic cells may be used for forming logic gates or to build optical logic networks or devices with intention of for example of realising logic algebraic operations. An instance of a use of this kind may for instance be optical logical networks in the form of optical logic gates in order to realise boolean functions as AND, NOT etc. Such logic algebraic or boolean operations will be well-known to persons skilled in the art and it shall be unnecessary to discuss them in greater detail. It shall however be understood that by using a two-valued (binary) logic an optical logical gate which realises functions such as logic conjunction, logic autjunction, logic veljunction, logic equivalence and logic implication, consists of two optical logic elements according to the invention and connected to a common output. Logic negation of course may be realised by a single optical logic element.

Figure 10C:
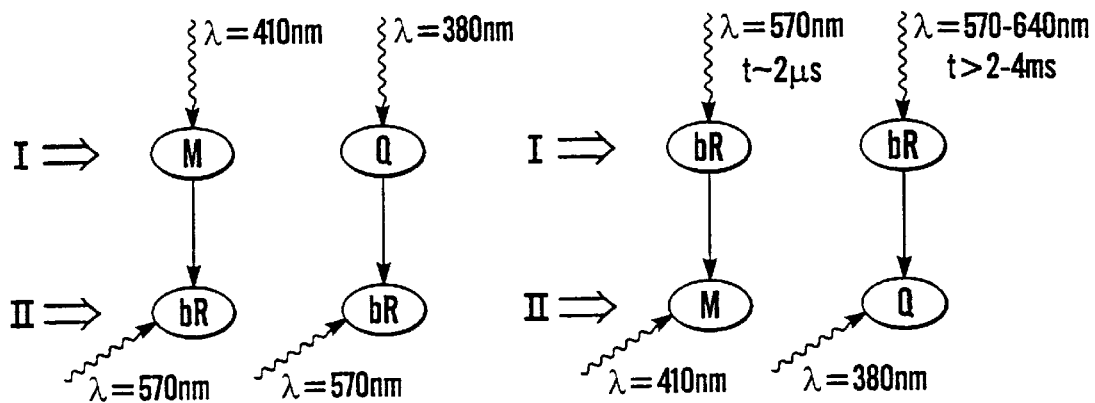
Figure 10C:
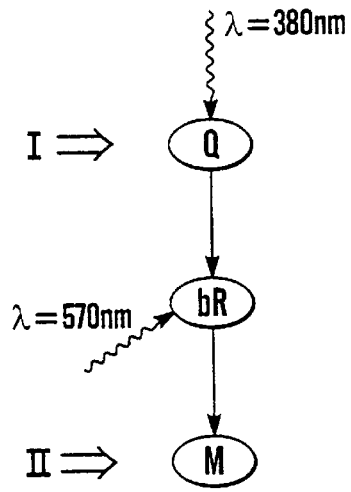
Figure 10D:
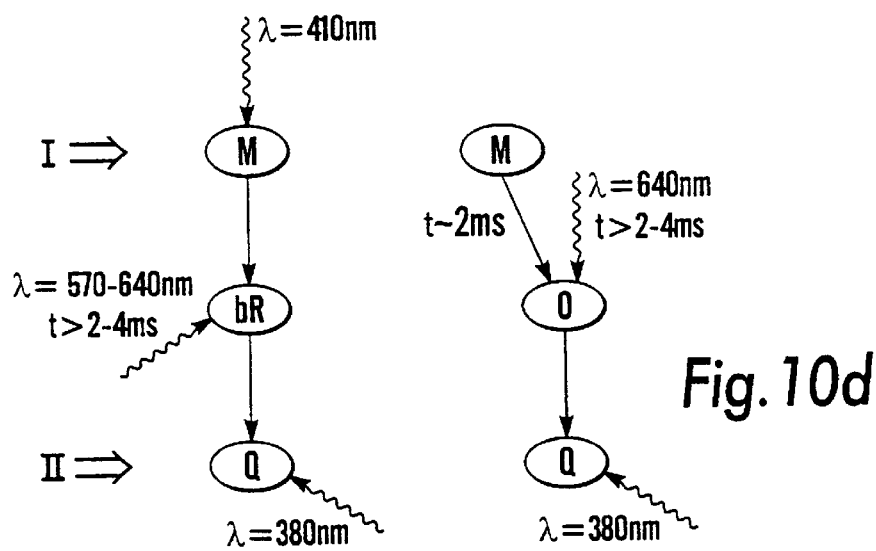

Preferably a switching of the optical logic element according to the invention implies causing a transition from the present state in the optical logic element to another state with simultaneous and immediately following detection of the second state. If the respective states initially are stable or metastable, the detection may take place at an undefined succeeding point of time and corresponds to the usual read operation. As shown in FIG. 10a the first state denoted as I can either be the metastabile M state or the metastable Q state and the second state denoted with II the bR state of the bacteriorhodopsin or vice versa and the transition from the M state or the Q state caused by irradiation with light tuned to the absorption band or the excitation wavelength for respectively the M- or Q state and the detection of bR with light tuned to the absorption band for bR. FIG. 10b shows switching with use of bR state as the initial state I and respectively the M- and the Q state as the second state II. FIG. 10c shows switching from the Q state I to the M state II and FIG. 10d switching from the M state I to the Q state II. The respective transitions which are shown in FIGS. 10a–d are in each single case caused with light tuned to the respective absorption band or the excitation wavelength for the initial state I. Specifically for transition from the Q state to the M state the irradiation is interrupted when a significant fraction of the molecules in the bR state has reached the M state and thereby the transition from the M state to the Q state the irradiation continues until a significant fraction of the molecules in the bR state has reached Q or if irradiation takes place with light tuned to respectively the absorption band or the excitation wavelength for the O state which follows the M state in the photocycle, until the molecules in the M state substantially have reached the Q state.

From FIG. 10a it will be seen that by using the M state or the Q state as the initial state I and the ground state bR as the second state II, the switching takes place very fast. The reset (or setting to zero) from the ground state bR to the M state takes only somewhat over 100 µs, while the reset from the ground state bR to the Q state takes considerably longer time, typically a few milliseconds, Also by using the ground state bR or the Q state as initial state I and the M state as second state II, the switching may take place correspondingly fast (FIGS. 10b, c) with a very quick reset from the M state to the bR state and a slow reset from the M state to the Q state (>2 ms). If the optical logic element according to the invention is used for realising for instance logic gates and networks in an optical logic device it is desirable that the switching shall take place fast and this implies that it will be advantageous to choose an initial state wherein switching to the second state is caused by a photochemical reaction only, thus a pure excitation process. Reset or the setting to 0, i.e. bringing the optical logic element back to the ground state, will usually be much less critical with regard to time and hence it does not matter that much that the reset comprises thermal relaxation processes.—In an optical logic device with a large number of optical logic elements the optical logic elements further may switched and reset in parallel and the switching rate of the device then will be determined by how many logic elements which may be addressed simultaneously.

It is however, no condition for a switching operation that both states are either stable or metastable. It is also thinkable that the switching operation may be effected by causing a transition from an initial metastable state or from the ground state to a short unstable state in the photocycle, such that switching and reset may take place extremely fast. For instance can this in the case of using bacteriorhodopsin as the light-sensitive material take place by using the ground state bR as the initial state and by the other state for instance being the very short-lived K state that follows in the photocycle. The transition from the bR state to the K state which is an excitation-induced reaction, has an excitation time constant of only 10 picoseconds which are dependent of intensity, absorption coefficient and quantum efficiency. A not shown unstable state J however, is present in that part of the photocycle which lies between the bR state and the K state, but will not have any mentionable effect on the switching. The residence time in the K state is at most a few microseconds, whereafter the K state relaxes to the L state. This implies that the detection of the K state must be precisely tuned in time. The K state transfers by thermal relaxation to the M state after about 100 microseconds and this implies that the optical logic element may be set to zero in this switching operation by irradiating the M state with light on a wavelength of 410 nm, such that there will be an excitation transition from the M state back to the bR state.

The very short detection window of two microseconds for the K state may cause problems if the detection shall take place in absorption. A possible solution is to let the detection take place in emission. It is supposed that the bacteriorhodopsin fluoresces in the K state and the fluorescence emission may be detected in the detector with a supposedly better sensitivity than what would be the case by using absorption detection. So far there are too little knowledge of the fluorescence properties of the different unstable and metastable states of the bacteriorhodopsin. The same is the case of other light-sensitive organic substances which may be used in the present invention, but if the switching operation implies use of an unstable state in such materials, a detection of fluorescence, i.e. detection in emission, evidently may offer advantages when the switching operation takes place very fast and the detection window is very narrow.

In accordance with the invention the multistable optical logic element and the method for optical addressing of the same may be used in the optical logic device for storing and processing of data. With processing of data there shall in this case be understood that the optical logic element is combined in optical logic networks to perform algebraic operations with use of optical logic gates which realises these functions or to perform binary arithmetic operations with the use of registers which realises such operations. Such optical logic gates or optical arithmetic registers may be realised in a technology which is analog to corresponding semiconductor-based devices and is besides disclosed in the literature and well-known to persons skilled in the art, such that it here will be unnecessary to discuss the required network architecture in detail.

An optical logic device of this kind need not be realised with proximity-addressable optical logic elements and a scheme for a two-dimensional (planar) memory device with use of optical active structures in the form of microlens matrices is shown schematically and exploded in FIG. 11. Herein the optical logic elements' light-sensitive material has a structure in the form of layer which forms an array 13 of these structures, as each single structure may be regarded as an element in the array. Assigned to each element in the array 13 of the light-sensitive organic material there is provided an indexing emitter array 14 and between the emitter array and the light-sensitive organic material there is provided a correspondingly indexing spatial light modulator SLM or a sheet 15 of small lenses or micro-lenses. The structure of the matrix 13 which in reality is provided adjacent to the lens sheet 15 is respectively form-adapted to the small lenses. Instead of small lenses or microlenses, i.e. refractive structures, diffractive structures might also be used. On the opposite side and under the array 13 of organic light-sensitive material there is then provided a detector array 16 indexing in a corresponding manner with each single structure of the light-sensitive organic material. The addressing of an optical logic element in this device is shown by light beams and the focusing to the light-sensitive material in the array 13 is implicated by means of a light beam vertex. Corresponding optical logic devices are known from the patent literature, but employ burn films, fluorescent layers and other media which makes a change of state possible for writing and reading of data. An optical logic device of the above-mentioned kind based on the optical logic element according to the present invention will emerge as a two-dimensional sheet with different components provided in layers and what is required thereof is that there shall be a unique relation between the emitter and the assigned optical logic element, something which may be achieved by using a spatial light modulator SLM. For certain operational modes, for instance data read-out, one-many-relations may be used without any intervening spatial light modulator. This implies that for instance the detector no longer need to be an array, but can be realised globally.

If proximity-addressable optical logic elements according to the invention are used, it is naturally no longer necessary with optical active structures in the form of lenses or diffractive elements and neither is it any longer necessary with a spatial light modulator. The optical logic device may then be formed by large connected sheets, and these sheets may again be stacked upon each other such that a volumetric optical logic device is provided. Optical logical devices of this kind is disclosed in the International Patent Application PCT/NO97/00154 which hereby is incorporated by reference and which is assigned to the present applicant.

Figure 12A:
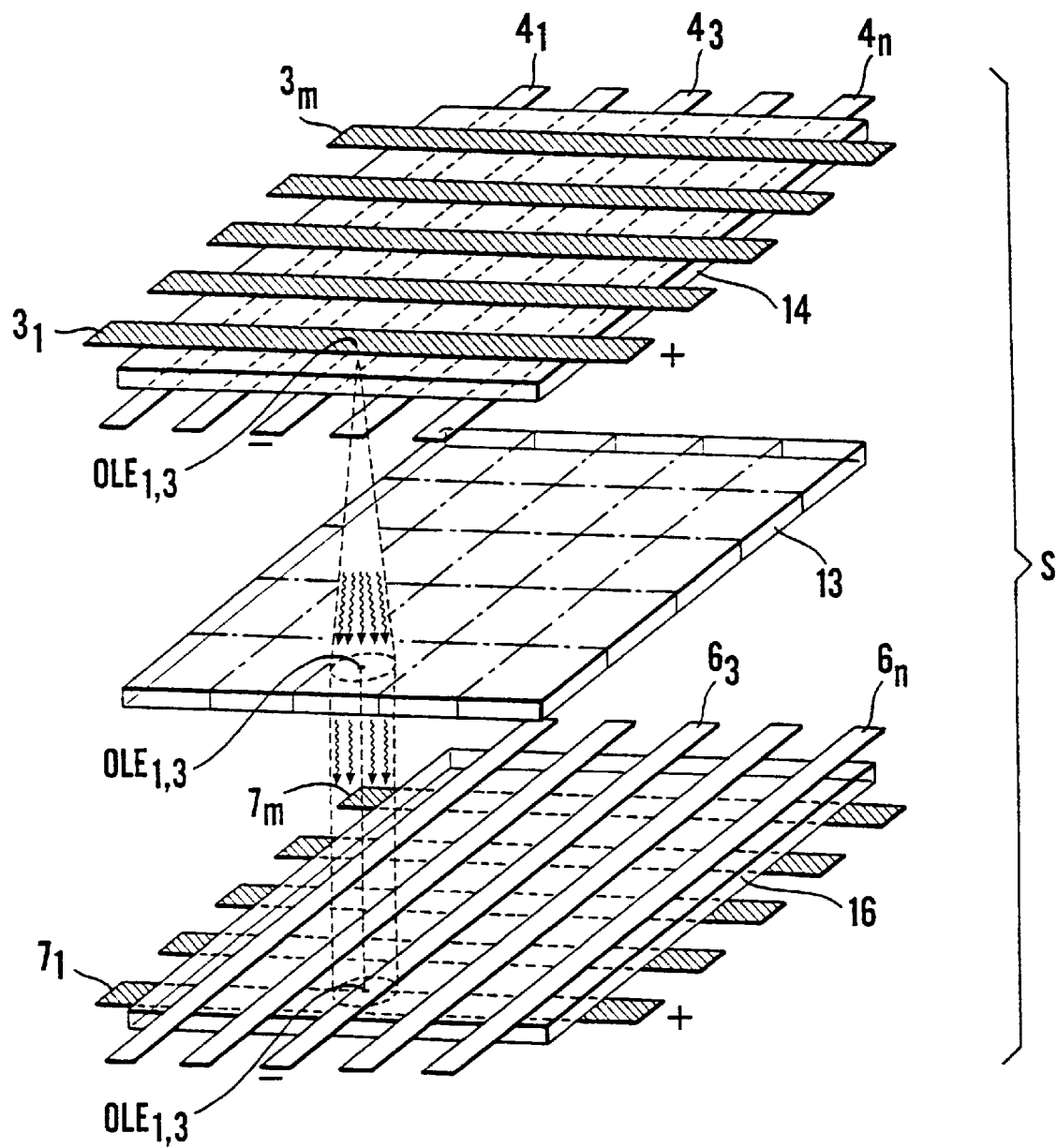

The disposition of proximity-addressable optical logic elements in an array as shown in FIG. 12a, wherein single layers of the array, viz. the emitters 14, the light-sensitive organic material 13 and the detector 16 are shown exploded. The array consist of m·n logic elements and is in FIG. 12a in reality shown as a 5·5-array. On the emitter array 14 electrodes 3, 4 has been provided, cf. FIG. 3, and a light emitting diode in each intersection between the electrodes 3, 4 is generated by applying a voltage $V_E$. Consequently the emitter or the light emitting diode would emit light which acts on the light-sensitive organic material, for instance bacteriorhodopsin, in the array 13. The detection takes place in the detector arrays 16, wherein the illumination in each intersection point between the provided electrode 6, 7 correspondingly generates a light absorbing detector diode. The optical logic element which is formed in this way, is shown as $OLE_{1,3}$, with each of the layers of the arrays 13, 14, 16 in the present case for the sake of simplicity is shown as a 5·5-array.

Figure 12B:
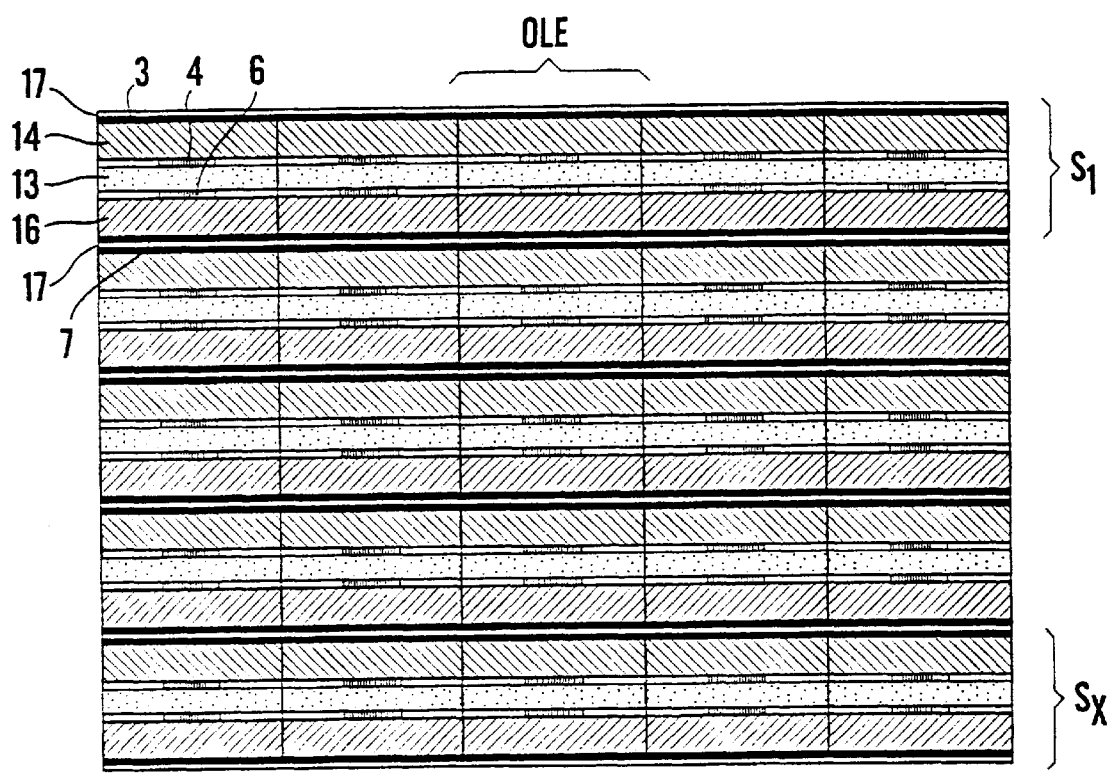

The optical logic device as shown in FIG. 12a can now be used for forming a volumetric optical logic device, comprising a number of layers or arrays $S_1 \ldots S_x$. A logical device of this kind is shown in section in FIG. 12b, and in each single layer S there are provided an emitter array 14, an array of organic light-sensitive material 13 and a detector array 16. As in FIG. 12a there are provided electrodes 3, 4; 6, 7 and the optical logic element is formed between the intersection points for respectively the electrodes 3 and 4 and the corresponding electrodes 6, 7. Between each of the layers S and possible also on the upper surface and the lower surface of the device it may be provided an electrically or possibly also an optically isolating layer. The device as shown in 12b is for the sake of simplicity suggested realised as a cube with 5·5·5 optical logic elements, hence a total of 125. The extension of an optical logic element OLE within the layer $S_1$ as shown in FIG. 12B and may correspond to the optical logic element $OLE_{1,3}$ as shown in FIG. 12a.

As each of the optical logic elements are addressed in proximity, i.e. both the emitter and the detector have been provided adjacent to the light-sensitive organic material and is located inside the device, it is only a practical question how may elements a m n array shall comprise and how many layers S shall be stacked upon each other.

If the optical logical device is realised as shown in FIG. 11, it may in a practical embodiment comprise a great number of logic elements provided in a two dimensional sheet. The dimensions of the optical logic element will be limited by the use of the optically active structure, as the wavelength of the light sets the limit for how small the optical logic element may be realised. Approximately this implies that the area of the optical logic element will be about proportional to the wavelength squared $\lambda^2$ and the storage density hence inversely proportional to $\lambda^2$, such that on a area of 1 cm$^2$ it may be realised an optical logical device with about $10^8$ optical logic elements according to the present invention.

If the optical logical device on the contrary is based on the use of proximity addressable optical logic elements according to the present invention as shown in FIGS. 12a, b, the only limitation in the scale factor is at least in theory the molecular dimensions of the light-sensitive material and the realisable least extent of the domains in the emitters. Practical experiments indicate that at the time being there may be realised optical logic elements with an extension some few ten-nanometers and correspondingly small conductive structures for the electrodes of the emitters and the detectors, such that the realistic cell size may lie between 2 500 nm$^2$ and 10 000 nm$^2$. At the worst this implies $10^{10}$ optical logic elements per cm$^2$ and realised volumetrically with a corresponding layer thickness it will be possible to obtain $10^{15}$ proximity-addressable optical logic elements in 1 cm$^3$. It is regarded as possible to achieve a linear scale improvement of one order of magnitude and then it may be realised $10^{18}$ optical logic elements according to the present invention in 1 cm$^3$. In order to give an indication of the storage capacity of an optical logical device of this kind, it may be suggested that it corresponds to the storage of $10^{13}$ ordinary book paces which should be sufficient for most kinds of archival storage.

Finally there shall be noticed an essential difference between the present invention and the already mentioned prior art as exemplified in the international patent application WO96/21228 wherein the light-sensitive organic material, namely bacteriorhodopsin, is used in bulk form, for instance inside a cube-shaped cuvette. This makes it necessary with a paging operation for accessing a relevant page formed in the bacteriorhodopsin, which once more leads to the disadvantages of the prior art as mentioned in the introduction.

Another essential difference between the present invention and prior art and which indirectly follows from the use of bacteriorhodopsin in the form of layer-like structure, is the use of the Q state as the basis of addressing or writing operations. For this purpose the optical logic device, as mentioned, is prepared in the manufacturing process, such that the bacteriorhodopsin is in the Q state in advance. This has far-reaching implications for the practical implementation. Firstly, the transition from the bR state to the Q state does not constitute a time-critical factor for an application and the process is in addition cumulative. Light with low intensity may hence be used in the preparation and besides there may be used miniaturised light emitting diodes. In contrast thereto the writing process according to WO96/21228 uses the bR state as the basis and meets a critical time window at the branching point from the O to the P state where it is necessary with high intensity light, typically from a laser in order to cause a significant branching reaction.

Secondly write and erase operations may take place extremely fast, given a sufficiently intensive source of blue light, as this implies photoinduced transition rates between molecular states, viz. for writing from the Q state to the bR state or erasing the Q state for reinitialization from the bR state. Consequently slow thermal relaxation transitions between the other states in the photocycle of the bacteriorhodopsin are avoided. Thirdly the reading does not disturb the logical states of the molecules and hence it is not necessary with procedures for refresh.

Even if the present invention in the above substantially has been exemplified with the reference to the use of bacteriorhodopsin as the light-sensitive organic material, with the use of states in the bacteriorhodopsin's photocycle, it shall of course be understood that the invention is not limited to the use of bacteriorhodopsin or related compounds as the light-sensitive organic material, but that within the scope of the appended claims any other light-sensitive organic materials which may go through a photocycle and with properties analog with the bacteriorhodopsin may equally well be used.

What is claimed is:

1. Multistable optical logic element comprising:
    a light-sensitive organic material which can undergo a photocycle by irradiation with light of one or more suitable wavelengths, the photocycle having a physical ground state and also having one or more metastable physical states, wherein the states are assigned logical values,
    wherein the logic element initially and before any addressing thereto takes place is in a metastable state generated in advance, with a significant fraction of the molecules of said organic material forming the logic element populating the metastable state generated in advance,
    wherein the physical state of the molecules of the organic material can be changed in the photocycle by causing a transition from a metastable state to another metastable state or by causing a transition from the ground state to a metastable state or by causing a transition from a metastable state to the ground state, and
    wherein a change of the physical state of the molecules of the organic material causes a change in the logical value of the logic element, the change of the physical state taking place by optically writing, storing, erasing or switching of an assigned logical value.

2. Optical logic element according to claim 1, wherein the initial metastable state is the metastable state which is closest to the ground state at the end of the photocycle.

3. Optical logic element according to claim 1, wherein the light-sensitive material includes molecules of protein or a protein-like compound.

4. Optical logic element according to claim 3, wherein the protein is bacteriorhodopsin or a related compound.

5. Optical logic element according to claim 4, wherein the initial metastable state is the M state of the bacteriorhodopsin.

6. Optical logic element according to claim 4, wherein the initial metastable state is the Q state of the bacteriorhodopsin.

7. Multistable optical logic element, which is proximity-addressable by addressing taking place thereto over optical detectors directly without intervening active optical means, comprising a light-sensitive organic material which can undergo a photocycle by irradiation with light of one or more suitable wavelengths, the photocycle having a physical ground state, and also having one or more metastable physical states, wherein the states are assigned logical values,
    wherein the physical state of the logic element can be changed in the photocycle by causing a transition from a metastable state to another metastable state or by causing a transition from the ground state to a metastable state or by causing a transition from a metastable state to the ground state, and
    wherein a change of the physical state of the logic element causes a change in its logical value and takes place by optically writing, storing, erasing and switching of an assigned logic value,
    wherein the logic element initially and before an addressing thereto takes place is in a metastable state generated in advance, and
    wherein the light-sensitive organic material is provided in a substantially film-like structure or as a film-like structure and that adjacent or in this structure at least a color light source has been provided for optical addressing of the light-sensitive organic material and at least one color-sensitive optical detector has been provided for detection of the physical/logical state of the light-sensitive organic material.

8. Optical logic element according to claim 7, wherein the logic element initially and before an addressing thereto takes place is in a metastable state generated in advance, with a significant fraction of the molecules of said organic material populating the metastable state generated in advance.

9. Optical logic element according to claim 8, wherein the film-like structure comprises a matrix of optically transparent material, and the light-sensitive material is provided in the matrix.

10. Optical logic element according to claim 9, wherein the matrix is an optically transparent polymer.

11. Optical logic element according to claim 8, wherein the color light source is a wavelength-tunable light source.

12. Optical logic element according to claim 11, wherein the wavelength-tunable light source is a light-emitting polymer diode, the wavelength tuning taking place by controlling the drive voltage of the diode.

13. Optical logic element according to claim 8, wherein more than one color light source is provided, the color light sources being tuned to wavelengths or power bandwidths which respectively correspond to the excitation wavelength or the absorption bands of the ground state and one or more metastable states in the photocycle of the light-sensitive material.

14. Optical logic element according to claim 8, wherein the color-sensitive optical detector is a multispectral optical detector.

15. Optical logic element according to claim 8, wherein the color-sensitive optical detector is a light-absorbing polymer diode.

16. Optical logic element according to claim 8, wherein more than one color-sensitive optical detector is provided, the detectors being tuned to wavelengths or bandwidths which respectively correspond to the excitation wavelengths or the absorption bands of the ground state and one or more metastable states of the photocycle.

17. A method of preparing a light-sensitive organic material which can undergo a photocycle by irradiation with light of one or more suitable wavelengths, wherein the photocycle in addition to the physical ground state comprises one or more metastable physical states, wherein the light-sensitive organic material is used as a switchable or data storage medium in a multistable logic element, the method comprising:
  irradiating the light-sensitive organic material in the ground state with light of a power bandwidth or at least one wavelength which initiates a photocycle and generates a desired initial metastable state in the photocycle said irradiating taking place over a period of time sufficiently long to cause a significant fraction of the molecular population of the organic material to arrive in the initial metastable state; and
  assigning a determined logical value for the logic element.

18. A method according to claim 17, wherein the light-sensitive organic material is bacteriorhodopsin, and wherein the M state of the bacteriorhodopsin is generated as the desired initial metastable state.

19. A method according to claim 18, wherein the photocycle is initiated and the M state generated by irradiating the bacteriorhodopsin with light of a power bandwidth which corresponds to the absorption band of the ground state bR or with the light of a wavelength which corresponds to the excitation wavelength of the ground state bR, the irradiation being terminated when a significant fraction of the bacteriorhodopsin molecules has reached the M state.

20. A method according to claim 17, wherein the light-sensitive material is bacteriorhodopsin, and wherein the Q state of the bacteriorhodopsin is generated as the desired initial metastable state.

21. A method according to claim 20, wherein the photocycle is initiated and the Q state generated by irradiating the bacteriorhodopsin with light of a power bandwidth which substantially corresponds to the absorption band of the ground state bR and the O state of the bacteriorhodopsin, said irradiation continuing until a significant fraction of the bacteriorhodopsin molecules has reached the Q state.

22. A method according to claim 20, wherein the photocycle is initiated and the Q state generated by irradiating the bacteriorhodopsin with light of two different wavelengths, the first wavelength substantially corresponding to the excitation wavelength of the ground state bR of the bacteriorhodopsin and the second wavelength substantially corresponding to the excitation wavelength of the O state of the bacteriorhodopsin, the irradiation continuing until a significant fraction of the bacteriorhodopsin molecules has reached the Q state.

23. A method for optically determining the logical value of a multistable optical logic element having a light-sensitive organic material which can undergo a photocycle by irradiation with light of one or more suitable wavelengths, the photocycle having a physical ground state and also having one or more metastable physical states, wherein the states are assigned logical values, wherein the logic element initially and before any addressing thereto takes place is in a metastable state generated in advance, with a significant fraction of the molecular population of said organic material forming the logic element being in the metastable state generated in advance, wherein the physical state of the logic element can be changed from a first state to a second state by causing a transition from a metastable state to another metastable state or by causing a transition from the ground state to a metastable state or by causing a transition from a metastable state to the ground state, and wherein a change of the physical state of the logic element causes a change in its logical value, the change of the physical state taking place by optically writing, storing, erasing or switching of an assigned logical value, said method for determining comprising at least one of the following steps:
  writing a logical value to the optical logic element;
  reading a logical value of the optical logic element;
  storing a logical value to the optical logic element;
  erasing a logical value of the optical logic element; and
  switching of a logical value of the optical logic element,
  wherein said writing and storing steps include causing a transition of the molecular population of said organic material from the initial metastable state to another metastable state, or to the ground states, if the logical value assigned to the logic element is to be changed into a logical value assigned to the other metastable state, or to the ground state, and keeping the molecular population of said organic material in the initial metastable state if the logical value is to be unchanged,
  wherein said reading step includes detecting the state of the molecular population of said organic material to determine the assigned logical value,
  wherein said erasing step includes causing a transition for the molecular population of said organic material from the ground state if the optical logic element is in the ground state by once more initiating a photocycle which switches the optical logic element back to the initial metastable state, or keeping the state unchanged if the optical logic element already is in the initial metastable state, or causing a transition from another metastable state back to the initial metastable state, either by way of the ground state or directly, if the optical logic element is in another metastable state, and wherein said switching step includes causing a transition of the molecular population of said organic material from a present state to another state having the opposite logical value.

24. A method according to claim 23, wherein the transition from a state to another in said writing and storing steps are caused by irradiating with light of a power bandwidth or of a wavelength which is tuned to the absorption band or the excitation wavelength, respectively, of the initial metastable state.

25. A method according to claim 24, wherein the light-sensitive organic material is bacteriorhodopsin and the initial metastable state is the Q state of the bacteriorhodopsin, and wherein the power-bandwidth or the wavelength is tuned to the absorption band or the excitation wavelength, respectively, of the Q state.

26. A method according to claim 23, wherein the detection of the state of the optical logic element for determining the assigned logical value in said reading step is caused by irradiating with light of a power bandwidth or a wavelength tuned to the absorption band or the excitation wavelength, respectively, of the initial metastable state.

27. A method according to claim 26, wherein the light-sensitive organic material is bacteriorhodopsin, and wherein the power bandwidth or the wavelength is tuned to the absorption band or the excitation wavelength, respectively, of the Q state of the bacteriorhodopsin.

28. A method according to claim 27, wherein the irradiation takes place with a pulse of an intensity so low or of a duration so short that the photoreaction from the Q state substantially is not initiated.

29. A method according to claim 23, wherein the transition from the ground state to the initial metastable state in said erasing step is effected by irradiating with light of power bandwidth or wavelength tuned to the absorption band or the excitation wavelength of the ground state, respectively, such that the photocycle is initiated once more.

30. A method according to claim 29, wherein the light-sensitive material is bacteriorhodopsin and the initial metastable state is the Q state of the bacteriorhodopsin, wherein the power bandwidth or the wavelength is tuned to the absorption bands or the excitation wavelengths, respectively, of the ground state bR of the bacteriorhodopsin and the O state of the bacteriorhodopsin.

31. A method according to claim 30, wherein irradiating takes place using a pulse with sufficient intensity or duration to transfer a significant fraction of the molecules from the ground state of the bacteriorhodopsin bR into the Q state.

32. A method according to claim 23, wherein said switching step is caused by irradiating with light having a power bandwidth or a wavelength tuned to the absorption band or excitation wavelength of the present state.

33. A method according to claim 23, wherein the light-sensitive material is bacteriorhodopsin, wherein the first state either is one of the metastable states M or Q of the bacteriorhodopsin and the second state is the ground state bR of the bacteriorhodopsin, or the first state is the ground state bR and the second state one of the metastable state M or Q, or the first state is the metastable state Q and the second state is the metastable state M, or the first state is the metastable state M and the second state is the metastable state Q, wherein the transition from the M state or the Q state to ground state is caused by irradiating with light tuned to the absorption band or the excitation wavelength of M or Q and the detection of bR taking place with light tuned to the absorption band of bR, wherein the transition from the ground state bR to the M state or to the Q state is caused by irradiating with light respectively tuned to the absorption band or the excitation wavelength of bR tuned to the absorption bands or the excitation wavelengths for bR and the O state of the bacteriorhodopsin, the irradiation being respectively terminated when a significant fraction of the molecules in bR has reached M or goes on until a significant fraction of the molecules in bR has reached Q, and the detection of M or Q taking place with light tuned to the absorption band for respectively M or Q, wherein the transition from the Q state to the M state is caused by irradiation with light tuned to the absorption band and the excitation wavelength of Q, such that Q transfers to the ground state bR, whereafter a new photocycle is initiated by an irradiation with light tuned to the absorption band or the excitation wavelength of bR, the irradiation being interrupted when a significant fraction of the molecules in bR has reached M, and the detection of M taking place with light tuned to the absorption band of M, and wherein the transition from the M state to the Q state is caused I) by irradiation with light tuned to the absorption band or the excitation wavelength of M until the molecules in the M state substantially has been transferred to the ground state bR and by succeeding irradiation with light respectively tuned to the absorption bands of the bR and the O state that follows after M in the photocycle, or the excitation wavelengths of the ground state bR and the O state, the irradiation continuing until a significant fraction of the molecules in the bR state has reached Q and the detection taking place with light tuned to the absorption band of Q, or II) by irradiation with light tuned to respectively the absorption band or the excitation wavelength of the O state following after M in the photocycle, the irradiation continuing until the molecules in the M state substantially has reached Q and the detection taking place with light tuned to the absorption band of Q.

34. A device comprising:

a plurality of multistable optical logic elements, each logic element including a light-sensitive organic material which can undergo a photocycle by irradiation with light of one or more suitable wavelengths, the photocycle having a physical ground state and also having one or more metastable physical states, wherein the states are assigned logical values, wherein each logic element initially and before any addressing thereto takes place is in a metastable state generated in advance, with a significant fraction of the molecules of the organic material populating the metastable state generated in advance, wherein the physical state of the molecules of the organic material can be changed in the photocycle by causing a transition from a metastable state to another metastable state or by causing a transition from the ground state to a metastable state or by causing a transition from a metastable state to the ground state, and wherein a change of the physical state of the molecules of a multistable optical logic element causes a change in the logical value of said multistable optical logic element, the change of the physical state taking place by optically writing, storing, erasing or switching of an assigned logical value.

* * * * *